United States Patent
Melanson

(10) Patent No.: US 7,170,434 B2
(45) Date of Patent: Jan. 30, 2007

(54) LOOK-AHEAD DELTA SIGMA MODULATOR WITH QUANTIZATION USING NATURAL AND PATTERN LOOP FILTER RESPONSES

(75) Inventor: John L. Melanson, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 10/995,731

(22) Filed: Nov. 22, 2004

(65) Prior Publication Data

US 2005/0156768 A1 Jul. 21, 2005

Related U.S. Application Data

(60) Provisional application No. 60/588,951, filed on Jul. 19, 2004, provisional application No. 60/539,132, filed on Jan. 26, 2004, provisional application No. 60/537,385, filed on Jan. 16, 2004.

(51) Int. Cl.
  *H03M 3/00* (2006.01)
  *H03M 1/12* (2006.01)
(52) U.S. Cl. .................................... 341/143; 341/155
(58) Field of Classification Search ............... 341/143, 341/144, 61, 126, 145, 150, 155, 157, 159, 341/131; 330/10, 282; 375/148, 247; 704/222, 704/243
See application file for complete search history.

(56) References Cited

U.S. PATENT DOCUMENTS 5,548,286 A 8/1996 Craven (Continued)

FOREIGN PATENT DOCUMENTS

EP 0512687 11/1992

(Continued)

OTHER PUBLICATIONS

Angus, James A.S., "Tree Based Lookahead Sigma Delta Modulators," Audio Engineering Society 114th Convention, Convention Paper 5825, Mar. 22-25, 2003.

(Continued)

*Primary Examiner*—Howard L. William
(74) *Attorney, Agent, or Firm*—Hamilton & Terrile, LLP; Kent B. Chambers

(57) ABSTRACT

A look-ahead delta sigma modulator reduces and simplifies the computations used to generate quantizer output values. Superposition can be applied to a loop filter response of the look-ahead delta sigma modulator. By superposition, the complete loop filter response for each output candidate vector equals the difference between a forced pattern response and a natural input signal response. The forced pattern response of the loop filter can be determined from the response to each output candidate vector with an input signal set to zero and loop filter state variables initially set to zero when determining the loop filter response for each output candidate vector. The natural input signal response of the loop filter can be determined from the response to each input signal vector with feedback data set to zero. The forced pattern response is independent of the input signal data and can be determined once for all input signal vectors $X_t$. The natural input signal response is independent of the feedback data and, therefore, need only be determined once for each output data value.

36 Claims, 16 Drawing Sheets

U.S. PATENT DOCUMENTS

| | | | |
|---|---|---|---|
| 5,550,544 A | 8/1996 | Sakiyama et al. | 341/155 |
| 5,585,801 A | 12/1996 | Thurston | 341/143 |
| 5,598,159 A | 1/1997 | Hein | |
| 5,708,433 A | 1/1998 | Craven | |
| 5,742,246 A | 4/1998 | Kuo et al. | |
| 5,757,300 A | 5/1998 | Koilpillai et al. | |
| 5,757,517 A | 5/1998 | Couwenhoven et al. | 358/463 |
| 5,786,779 A | 7/1998 | Chun et al. | |
| 5,977,899 A | 11/1999 | Adams | 341/145 |
| 6,067,515 A | 5/2000 | Cong et al. | 704/243 |
| 6,070,136 A | 5/2000 | Cong et al. | 704/222 |
| 6,112,218 A | 8/2000 | Gandhi et al. | |
| 6,160,505 A | 12/2000 | Vaishampayan | |
| 6,177,897 B1 | 1/2001 | Williams, III | |
| 6,232,899 B1 | 5/2001 | Craven | 341/126 |
| 6,310,518 B1 | 10/2001 | Swanson | |
| 6,313,773 B1 | 11/2001 | Wilson et al. | |
| 6,347,297 B1 | 2/2002 | Asghar et al. | 704/243 |
| 6,362,769 B1 | 3/2002 | Hovin et al. | 341/157 |
| 6,373,416 B1 | 4/2002 | McGrath | 341/143 |
| 6,392,576 B1 | 5/2002 | Wilson et al. | 341/143 |
| 6,418,172 B1 | 7/2002 | Raghavan et al. | 375/262 |
| 6,480,129 B1 | 11/2002 | Melanson | |
| 6,480,528 B1 | 11/2002 | Patel et al. | |
| 6,501,404 B2 | 12/2002 | Walker | 341/143 |
| 6,590,512 B2 | 7/2003 | Roh et al. | 341/143 |
| 6,639,531 B1 * | 10/2003 | Melanson | 341/143 |
| 6,724,332 B1 * | 4/2004 | Melanson | 341/143 |
| 6,741,123 B1 * | 5/2004 | Andersen et al. | 330/10 |
| 6,760,573 B2 | 7/2004 | Subrahmanya et al. | 455/192.2 |
| 6,822,594 B1 * | 11/2004 | Melanson et al. | 341/143 |
| 6,842,128 B2 | 1/2005 | Koh | |
| 6,842,486 B2 * | 1/2005 | Plisch et al. | 375/247 |
| 6,861,968 B2 * | 3/2005 | Melanson et al. | 341/143 |
| 6,873,278 B1 | 3/2005 | Ferguson et al. | |
| 6,873,280 B2 | 3/2005 | Robinson et al. | |
| 6,879,275 B1 | 4/2005 | Melanson | 341/143 |
| 6,888,484 B2 | 5/2005 | Kiss et al. | |
| 6,933,871 B2 * | 8/2005 | Melanson et al. | 341/143 |
| 6,940,434 B2 * | 9/2005 | Brooks | 341/131 |
| 6,943,716 B2 * | 9/2005 | Mallinson | 341/143 |
| 6,956,514 B1 * | 10/2005 | Melanson et al. | 341/143 |
| 6,967,606 B2 * | 11/2005 | Wiesbauer et al. | 341/143 |
| 7,009,543 B2 * | 3/2006 | Melanson | 341/143 |
| 2003/0086366 A1 | 5/2003 | Branlund et al. | 370/208 |
| 2003/0231729 A1 | 12/2003 | Chien et al. | 375/376 |
| 2005/0012649 A1 | 1/2005 | Adams et al. | |
| 2005/0052300 A1 | 3/2005 | Ranganathan | |

FOREIGN PATENT DOCUMENTS

| | | |
|---|---|---|
| EP | 1227595 | 7/2002 |
| JP | 2003-124812 | 4/2003 |
| JP | PUB. 2003-124812 | 4/2003 |

OTHER PUBLICATIONS

Harpe, Pieter, et al., "Efficient Trellis-Type Sigma Delta Modulator," Audio Engineering Society 114th Convention, Convention Paper 5845, Mar. 22-25, 2003.

Hawksford, M.O.J., "Parametrically Controlled Noise Shaping in Variable State-Step-Back Pseudo-Trellis SDM," Audio Engineering Society 115th Convention, Convention Paper, Oct. 10-13, 2003.

Kato, Hiroshi, "Trellis Noise-Shaping Converters and 1-bit Digital Audio," Audio Engineering Society 112th Convention, Convention Paper 5615, May 10-13, 2002.

Sony Electronics, Inc. and Philips Electronics N.V., "Super Audio Compact Disc, A Technical Proposal," 1997, no month.

J. Paulos et al., "Improved Signal-To-Noise Ratio Using Tri-Level Delta-Sigma Modulation," Reprinted from IEEE Proc. ISCAS, May 1987, pp. 245-248, no date.

E. Knapen et al., "Lossless Compression of 1-Bit Audio," J. Audio Eng. Soc., vol. 52, No. 3, Mar. 2004, pp. 190-199, no date.

Zetterberg, L.H. et al., "Adaptive Delta Modulation with Delayed Decision," IEEE Transactions on Communications, IEEE vol. COM-22, No. 9, Sep. 1974, pp. 1195-1198.

Stonick, J.T. et al., "Look-Ahead Decision-Feedback ΣΔ Modulation," IEEE International Conference on Acoustics, Speech and Signal Processing, New York, 1994, no month.

Abeysekera, S. et al., "Design of Multiplier Free FIR Filters Using a LADF Sigma-Delta Modulator," Circuits and Systems, 2000, Proceedings, ISCAS 2000 Geneva, The 2000 IEEE International Symposium, May 28-31, 2000, vol. 2, May 28, 2000, pp. 65-68.

Abeysekera, S.S. et al., "Performance Evaluation of 3rd Order Sigma-Delta Modulators via FPGA Implementation," ASIC/SOC Conference, 2001, Proceedings, 14th Annual IEEE International Sep. 12-15, 2001, pp. 13-17.

Magrath, A.J. et al., "Performance Enhancement of Sigma-Delta Modulator D-A Converters Using Non-Linear Techniques," 1996 IEEE Symposium on Circuits and Systems (ISCAS), vol. 2, May 12, 1996, pp. 277-280.

Magrath, A.J. et al., "Non-Linear Deterministic Dithering of Sigma-Delta Modulators," IEE Colloquium on Oversampling and Sigma Delta Strategies for DSP, 1995, pp. 1-6.

Lindfors, S., "A Two-Step Quantization ΔΣ-Modulator Architecture with Cascaded Digital Noise Cancellation," Electronics, Circuits and Systems, 2000, ICECS, The 7th IEEE International Conference, Dec. 17-20, 2000, vol. 1, pp. 125-128.

Harris, F.J. et al., "Implementation Considerations and Limitations for Dynamic Range Enhanced Analog to Digital Converters," IEEE International Conference on Acoustics, Speech and Signal Processing, May 23, 1989, pp. 1286-1289.

Fang, L. et al., "A Multi-Bit Sigma-Delta Modulator with Interstate Feedback," Circuits and Systems, 1998, Proceedings of the 1998 IEEE International Symposium, May 31-Jun. 3, 1998, vol. 1, pp. 583-586.

* cited by examiner $$H_x(z) = \frac{1}{(1-z^{-1})^2}$$

$$H_{fb}(z) = \frac{(-c2 + (c2 - c1)z^{-1})\, z^{-1}}{(1-z^{-1})^2}$$

$$H_x(z) = \frac{z^{-2}}{(1-z^{-1})^2}$$

$$H_{fb}(z) = \frac{(-c2 + (c2 - c1)z^{-1})\, z^{-1}}{(1-z^{-1})^2}$$

LOOK-AHEAD DELTA SIGMA MODULATOR WITH QUANTIZATION USING NATURAL AND PATTERN LOOP FILTER RESPONSES

CROSS-REFERENCE TO RELATED APPLICATION

This application claims the benefit under 35 U.S.C. § 119(e) of (i) U.S. Provisional Application No. 60/537,285, filed Jan. 16, 2004 and entitled "Look-Ahead Delta-sigma Modulators", (ii) U.S. Provisional Application No. 60/539,132, filed Jan. 26, 2004 and entitled "Signal Processing Systems with Look-Ahead Delta-Sigma Modulators", and (iii) U.S. Provisional Application No. 60/588,951, filed Jul. 19, 2004 and entitled "Signal Processing Systems with Look-Ahead Delta-Sigma Modulators". Provisional applications (i) through (iii) include example systems and methods and are incorporated by reference in their entireties.

BACKGROUND OF THE INVENTION

1. Field of the Invention

The present invention relates in general to the field of signal processing, and more specifically to a system and method for using natural and pattern loop filter responses to quantize input signal data.

2. Description of the Related Art

A few signal processing systems implement look-ahead delta-sigma modulators in an attempt to obtain superior input/output signal fidelity by minimizing long term error. "Delta-sigma modulators" are also commonly referred to using other interchangeable terms such as "sigma-delta modulators", "delta-sigma converters", "sigma delta converters", and "noise shapers".

Conventional research in look-ahead modulators primarily involves two threads. The first are the works of Hiroshi Kato, "Trellis Noise-Shaping Converters and 1-bit Digital Audio," AES 112$^{th}$ Convention, 2002 May 10–13 Munich, and Hiroshi Kato, Japanese Patent JP, 2003-124812 A, and further refinements described in Harpe, P., Reefman D., Janssen E., "Efficient Trellis-type Sigma Delta Modulator," AES 114$^{th}$ Convention, 2003 Mar. 22–25 Amsterdam (referred to herein as "Harpe"); James A. S. Angus, "Tree Based Look-ahead Sigma Delta Modulators," AES 114$^{th}$ Convention, 2003 Mar. 22–25 Amsterdam; James A. S. Angus, "Efficient Algorithms for Look-Ahead Sigma-Delta Modulators," AES 155$^{th}$ Convention, 2003 Oct. 10–13 New York; Janssen E., Reefman D., "Advances in Trellis based SDM structures," AES 115$^{th}$ Convention, 2003 Oct. 10–13 New York. This research targets solving the problems of 1-bit encoding of audio data for storage without using the steep anti-alias filters associated with pulse code modulation "PCM." The advent of super audio compact disc "SACD" audio storage, with its moderate oversampling ratios (32 or 64), motivated this work.

FIG. 1 depicts a prior art signal processing system 100 having a look-ahead delta-sigma modulator 102. The signal source 102 provides an input signal to pre-processing components 104. Preprocessing components 104 include an analog-to-digital converter ("ADC") and oversampling components to generate a k-bit, digital input signal x(n). For audio applications, x(n) generally represents a signal sampled at 44.1 kHz times an oversampling ratio, such as 64:1. Look-ahead modulator 106 quantizes input signal x(n) and shapes the quantization noise so that most of the quantization noise is moved out of the signal band of interest, e.g. approximately 0–20 kHz for audio applications. Each output signal y(n) (also referred to herein as an "output value") generally has one of two values selected from the set $\{+\Delta/2, -\Delta/2\}$ with "$\Delta$" representing the full swing of y(n). (For convenience, $\Delta/2$ will be represented as +1, and $-\Delta/2$ will be represented as −1.). The output signal y(n) can be processed further and, for example, used to drive an audio sound system or can be recorded directly onto a storage medium.

FIG. 2 depicts a schematic representation of a conventional look-ahead delta-sigma modulator 106 with a look-ahead depth of M. Table 1 describes an embodiment of the symbols used in FIG. 2.

TABLE 1

| Symbol | Definition |
| --- | --- |
| x(n) | The nth discrete input signal. |
| $X_t$ | Input signal vector at a time t. |
| y(n) | The nth discrete output signal. |
| $Y_{Di}$ | The ith output delayed by one candidate vector. |
| $C_i$ | The ith cost value vector = $H(D_i(z))$. |
| M | Look-ahead depth. |
| N | $N = r^M$ = The number of output signal candidate sets under consideration, and r = number of possible values for y(n). |
| i | i is selected from the set $\{0, 1, 2, \ldots N-1\}$. |
| $C^{(2)}_i$ | The ith cost value power. |
| $C^{(2)}_{min}$ | The minimum cost value power at time t. |

The look-ahead depth M refers to the dimension of each delayed output candidate vector $Y_{Di}$ used to determine output signal y(n). For time t, a negative delayed output candidate vector $-Y_{Di}$, $i \in \{0,1,2, \ldots, N-1\}$ and the input vector $X_t$ are inputs to noise shaping filter 202(i). For a look-ahead depth of M and y(n)=$\{-1, +1\}$, and without pruning output candidates, each of the N delayed output candidate vectors contains a unique set of elements. Each noise-shaping filter 202(i) of look-ahead delta-sigma modulator 106 uses a common set of filter state variables for time t during the calculations of respective cost value vectors $C_i$. Filter 202 maintains the actual filter state variables used during the calculation of each y(n). The state variables are updated with the selected y(n) output value. Loop filter 202 processes $X_i$ and $-Y_i$ to produce an error value, which in this embodiment is referred to as cost value vector $C_i$. Cost value vector $C_i$, and, thus, each element of cost value vector $C_i$ is a frequency weighted error value. In some embodiments of look-ahead delta-sigma modulator 106, input signal vector $x_t$ and delayed output candidate vectors $Y_{Di}$ are also used as direct inputs to filter 202(i).

Quantizer error and output generator 203 includes two modules to determine y(n). The cost function minimum search module 204 computes the cost value power, $C_i^{(2)}$, of each cost value vector $C_i$ in accordance with Equation 1, and determines the minimum cost value power at time t.

$$C_i^{(2)} = \sum_{t=1}^{t=M} [c_t]^2. \qquad \text{Equation 1}$$

"$c_t$" represents a cost value for time t, t=1 through M, in the cost vector $C_i$. Thus, the cost function minimum search module 204 of quantizer 203 attempts to minimize the energy out of loop filter 202. Minimizing the energy out of loop filter 202 effectively drives the input $C_i$ to a small value, which effectively results in a relatively high loop gain for look-ahead delta-sigma modulator 106 and, thus, modifies the noise shaping transfer function in an undesirable way.

The y(n) selector module 206 selects y(n) as the leading bit of $Y_i$ where $C_i^{(2)}{}_{min}$ represents the minimum cost value power.

For example, if M=2 and y∈{−1,+1}, then N=4, i□{0,1,2,3}, and Table 2 represents each of the Y output candidate vectors and $X_t$.

TABLE 2

|  | $Y_1$ | $Y_2$ | $Y_3$ | $Y_4$ | $X_t$ |
|---|---|---|---|---|---|
| $y_t$ | 0 | 0 | 1 | 1 | x(n) |
| $y_{t+1}$ | 0 | 1 | 0 | 1 | x(n + 1) |

If $C_3^{(2)}$ represents the minimum cost value power, then selector module 206 selects y(n)=1 because the first bit in output candidate vector $Y_3$ (the output candidate vector associated with $C_3^{(2)}$), equals 1. If $C_1^{(2)}$ represents the minimum cost value power, then selector module 206 selects y(n)=0 because the first bit in output candidate vector $Y_1$ (the output candidate vector associated with $C_1^{(2)}$), equals 0.

The second primary thread of look-ahead modulator research involves pulse width modulation ("PWM") amplifiers based on delta-sigma modulators combined with digital PWM modulation stages. The principal researchers have been Peter Craven and John L. Melanson. In U.S. Pat. No. 5,784,017 entitled "Analogue and Digital Converters Using Pulse Edge Modulations with Non-Linear Correction," inventor Peter Craven ("Craven"), which is incorporated herein by reference in its entirety, Craven described the use of look-ahead in delta-sigma modulators. The purpose of Craven was to ensure stability in alternating edge modulation, an inherently difficult modulation mode to stabilize. In the PWM case, the delta-sigma modulator is operating at a low oversampling ratio (typically 4–16), and quantization noise is a special problem.

FIG. 3 depicts quantizer 106 and noise shaping loop filter 202. The filter 202 can be considered as having a noise transfer function ("NTF") and a separate signal transfer function ("STF"), as described in commonly assigned U.S. patent application Ser. No. 10/900,877, filed Jul. 28, 2004, entitled "Signal Processing with Lookahead Modulator Noise Quantization Minimization", inventor John L. Melanson (referred to herein as the "Melanson I Patent" and in chapter 4 of Norsworthy et al, "Delta Sigma Data Converters—Theory, Design, and Simulation". 1997, ISBN 0-7803-1045-4. The noise transfer function ("NTF") equals $1/[1+z^{-1}*H_2(z)]$. Filter 202 is modeled to indicate the signal transfer function $H_1(z)$, the feedback signal transfer function $H_2(z)$, and quantization noise 302. The signal transfer function ("STF") equals $H_1(z)/[1+z^{-1}*H_2(z)]$. In some implementations, H1 and H2 are identical. In the general case, H1 and H2 differ.

FIG. 4A depicts a delta sigma modulator 400A with a fourth order noise shaping loop filter 402, quantizer 404, and feedback loop with a unit delay 406, which represents one embodiment of noise shaping filter 202. Constants k0, k1, k2, and k3 are chosen to set poles in the NTF of filter 300. G1 provides a zero (0) in the NTF, which is usually set near a high frequency end of the signal pass band. Filter 300 also includes a double zero at 0 Hz. The STF has a pure pole response cascaded with a pure delay.

FIG. 4B depicts a 3rd order infinite impulse response filter 400B with delays $z^{-1}$, feedback coefficients $C_0$, $C_1$, and $C_2$, and state variables sv0, sv1, and sv2. In infinite impulse response ("IIR") filters, one or more state variables are fed back during each time step to modify one or more of the next state variables. This makes it difficult to calculate future values of the filter output for look-ahead applications. Look ahead is of special interest in the case of delta-sigma modulation, where the feedback is quantized to a relatively small number of levels, and there are significant advantages to observing more than one potential feedback value at any given time.

One technique to implement an IIR filter adapted for look-ahead operations is depicted in IIR filter process 400C in FIG. 4C, which saves all of the state variables, advance the system clock to find future values, and then restore the state of the state variables. Operation 420 copies state variables to temporary memory, advances states with desired feedback N times ($N=2^m$ and m=lookahead depth) in operations 422, calculates state variables using desired output candidate vector elements in operation 424, stores the state variables in operation 426, and advances state one time in operation 428. The $3^{rd}$ order IIR filter 400B has a look-ahead depth of 4, the current output, and 2 future outputs. Another approach is to have multiple copies of the state variables, each representing the state variable for various states of advance or for various feedback possibilities. This complicates the calculation, and increases the size of the state variable memory, in some cases exponentially with the look-ahead depth. In all of these cases, the future values of the input are needed to calculate the future outputs. State variable memory operations 400D for filter 400B and the $z\hat{}-3$ delay at the input is depicted in FIG. 4D.

In a Trellis modulator, output candidate vectors Yi (also referred to as "patterns"), extending for M sample periods, are tried as candidates for the quantizer output. The power out of the filter, signal Ci, is summed for each output candidate vector $Y_i$, and the lowest power associated output candidate vector is chosen. The first bit of the chosen output candidate vector $Y_i$ is chosen as the next output value y(n), and the iteration is repeated for the next input vector $X_{t+1}$.

Conventional look-ahead delta sigma modulators require a great deal of computation and state storage. For a look-ahead depth of 8 bits, in the simplest case 256 copies of the delta sigma modulator are required. Most research has been directed to simplifying the computation by pruning the search so that only a moderate fraction of the $2^M$ cases are calculated. Conventional technology has not proposed a reasonable way to find the closest matching output signal sets for each time t directly given that without pruning there are $2^M$ possible reasonable combinations to search and the length of output signals. Y[n] for a 1 minute signal is 60*44100*64 (i.e., 60 seconds, 44.1 kHz sampling frequency, and 64:1 oversampling ratio). Trellis searches, tree searches, and pruning have all been proposed as solutions to reducing the computation.

SUMMARY OF THE INVENTION

In one embodiment of the present invention, a method of processing input signal data using a look-ahead delta sigma modulator of depth N using natural and pattern loop filter responses, wherein N is greater than or equal to two, includes determining a set of forced pattern responses of a loop filter of the look-ahead delta sigma modulator to a set of vectors. The method also includes determining a natural response of the loop filter of the look-ahead delta sigma modulator to a set of input data signal samples. The method further includes quantizing each input signal data sample by applying predetermined decision criteria to determine a best match between each forced pattern response and the natural response and selecting output data from an output candidate vector associated with the forced pattern response used to determine the best match.

In another embodiment of the present invention, a signal processing system includes a look-ahead delta sigma modulator. The look-ahead delta-sigma modulator includes a loop filter and a pattern response generator coupled to the loop filter to determine a set of forced pattern responses of the loop filter to a set of vectors. The look-ahead delta-sigma modulator further includes a natural response generator to determine a natural response of the loop filter to a set of input data signal samples and a quantizer to receive output data from the loop filter and the set of pattern responses, wherein the quantizer includes a function generator to quantize each input signal data sample by applying predetermined decision criteria to determine a best match between each forced pattern response and the natural response and selecting output data from an output candidate vector associated with the forced pattern response used to determine the best match.

In another embodiment of the present invention, an apparatus for processing input signal data using a look-ahead delta sigma modulator of depth N using natural and pattern loop filter responses, wherein N is greater than or equal to two (2), includes means for determining a set of forced pattern responses of a loop filter of the look-ahead delta sigma modulator to a set of vectors. The apparatus further includes means for determining a natural response of the loop filter of the look-ahead delta sigma modulator to a set of input data signal samples and means for quantizing each input signal data sample by applying predetermined decision criteria to determine a best match between each forced pattern response and the natural response and selecting output data from an output candidate vector associated with the forced pattern response used to determine the best match.

In another embodiment of the present invention, a method of processing input signal data using a look-ahead delta sigma modulator of depth N using natural and pattern loop filter responses, wherein N is greater than or equal to two, the method includes determining a response of a loop filter of the look-ahead delta-sigma modulator from a natural response of the loop filter to a set of N input data signal samples and a forced pattern response of the loop filter to a set of vectors. The method also includes quantizing each input signal data sample by applying predetermined decision criteria to determine a best match between each forced pattern response and the natural response and selecting output data from an output candidate vector associated with the forced response used to determine the best match.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

The nomenclature used in the below description is the same as used in the Background section above unless indicated otherwise.

The look-ahead delta sigma modulators of the signal processing systems described herein reduce the amount of processing by simplifying the computations used to generate quantizer output values. In contrast to pruning, a reduction in the number of performed computations to determine quantizer output data can be accomplished without reducing the accuracy of the look-ahead delta sigma modulator. Superposition can be applied to a loop filter response of the look-ahead delta sigma modulator. By superposition, the complete loop filter response for each vector in a set of vectors equals the difference between a forced pattern response and a natural input signal response. In one embodiment, the set of vectors used to determine the forced pattern response is identical to a set of output candidate vectors. In another embodiment, the set of vectors used to determine the forced pattern response represents approximations to a set of output candidate vectors that provide acceptable results. The forced pattern response of the loop filter can be determined from the response to each of the vectors with an input signal set to at least approximately zero (0) and the initial state variables in the loop filter set to at least approximately zero prior to determining the loop filter response of each vector. "At least approximately zero" includes zero (0) and values small enough to adequately determine the response of the filter within a desired accuracy. The pattern response of the loop filter can also be referred to as a forced pattern response of the loop filter to a set of vectors. The natural input signal response of the loop filter can be determined from the response to each input signal vector with feedback data set to at least approximately zero. The forced pattern response is independent of the input signal data and, therefore, can be determined once for all input signal vectors $X_t$. The natural input signal response is independent of the feedback data and, therefore, need only be determined once for each output data value. The number of computations can be further reduced by eliminating duplicate computations when determining the cost values for each pattern, and eliminating forced pattern responses that lead to results that can not meet predetermined 'best match' criteria between the natural and forced pattern responses.

Figure 5:
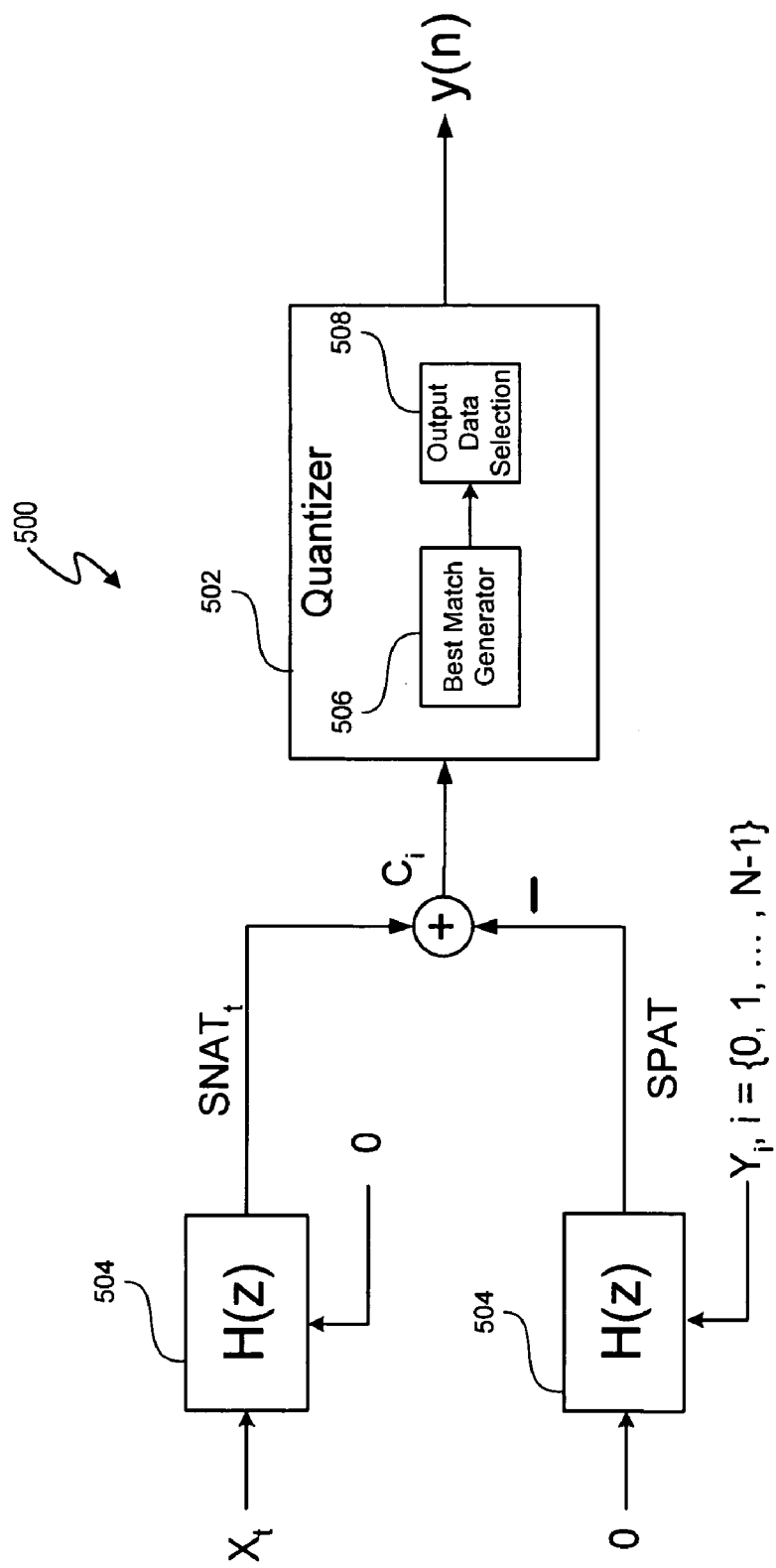
FIG. 5 depicts a look-ahead delta sigma modulator that utilizes superposition concepts to separate the input signal natural response SNAT from the forced pattern response SPAT.

FIG. 5 depicts a look-ahead delta sigma modulator 500 that utilizes superposition concepts to separate the input signal natural response SNAT from the forced pattern response SPAT. Filter output vector $C_i$ represents the response of loop filter 504 and equals the input signal natural response SNAT minus the forced pattern response SPAT for output candidate vector $Y_i$. Other vectors that approximate the output candidate vector Yi can be alternatively used to determine the forced pattern response SPAT. The minus sign in the summation is due to the convention used herein of assuming that the SPAT patterns are the result of applying feedback candidate vectors with a positive sign at the filter input, and that the filter utilizes a negative sign in the operating structure. This convention allows for the search to be considered as one of minimum distance between SNAT and the set of SPATs. "SPAT" is a vector representing the forced pattern response of the $i^{th}$ output candidate vector $Y_i$, and $SNAT_t$ is the loop filter natural response for input signal $X_t$. In at least one embodiment, the loop filter 504 is chosen to optimize the noise shaping transfer function, and noise shaping loop filter 202 is an example.

For each output sample, the quantizer 502 uses a set of the filter output vectors $C_i$ to quantize the input signal vector $X_t$ and determine the output data y(n) for that sample. The best match generator 506 searches for the best match between the input signal natural response $SNAT_t$ and the forced pattern responses SPAT and output selection module 508 chooses the value for output data y(n). "Best" can be defined as closest matching in the signal band of interest. "Closest matching" can be predefined, for example, in a power sense (lowest distance), in a weighted distance sense, in a minimum/maximum sense, in a psycho-acoustically weighted sense, or in another desired measure. A "signal band of interest" is, for example, a frequency band containing a signal with data of interest. For example, an audio signal band of interest is approximately 0 Hz to 25 kHz. Thus, in one embodiment, the "best" output signal pattern Y[n] is the pattern Y[n] such that the loop filter output response $C_i$ has the lowest power. Determining the loop filter output response with the lowest signal power $C_{i\ min}$ and choosing the output data y(n) are illustratively described in more detail in the Melanson I Patent and in commonly assigned U.S. patent application Ser. No. 10/875,920, filed on Jun. 22, 2004, now U.S. Pat. No. 6,879,275, issued Apr. 12, 2005, entitled "Signal Processing with a Look-ahead Modulator Having Time Weighted Error Values", by inventor John L. Melanson (referred to herein as the "Melanson II Patent"). The signal processing system described herein can be adapted to determine the best, closest matching output signal pattern under varying constraints and is not limited to the constraints of "best" and "closest matching" set forth herein, but rather constraints can be defined to accomplish desired goals. Additionally, it is not necessary to only select the output for one sample per search, two or more samples may be selected, and the filter advanced appropriately for that number of samples.

Figure 6:
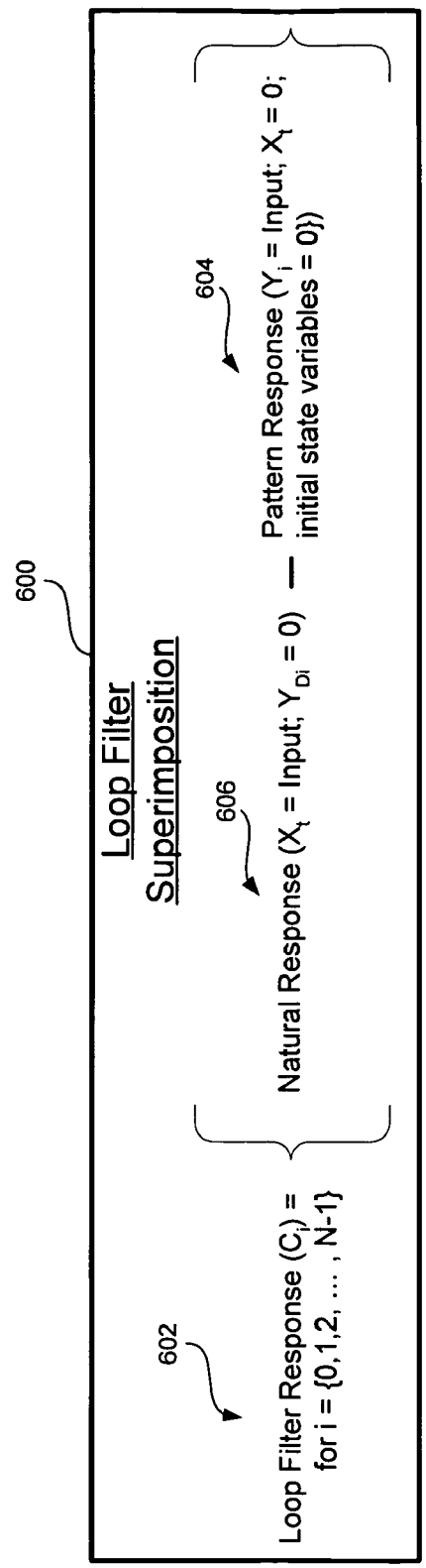
FIG. 6 depicts the superposition of a loop filter response.

FIG. 6 depicts the superposition 600 of the loop filter response $C_i$ 602 for each output candidate vector $Y_i$ and each input signal $X_t$. In one embodiment, the set of all forced pattern responses SPAT 604 represents the set of all loop filter 504 responses for each output candidate vector Y1. In one embodiment, i={0, 1, ..., N-1}. As described in more detail below, calculation of some of the forced pattern responses produce duplicate calculations in determining output data y(n). Duplicate calculations can be eliminated. Additionally, some forced pattern responses can not lead to results that will not meet predetermined 'best match' criteria between the natural and forced pattern responses and, thus, also do not have to be considered. Accordingly, i can be an element of a subset of the set {0, 1, ..., N-1}. The forced pattern response for each respective output candidate vector $Y_i$ can be determined by setting the input signal to zero (0), setting the initial state variables of loop filter 504 to zero (0), and determining the loop filter forced pattern response $SPAT_i$. Because the forced pattern responses are independent of the input signal data values, the forced pattern response SPAT can be precomputed once and stored for continual use in determining output value y(n). Precomputing the forced pattern responses once and reusing the precomputed responses reduces the amount of computations used to determine y(n). In a circuit implementation, storing precomputed responses in a memory reduces the quantity of circuitry needed to quantize the input signal $X_t$.

The superposition 600 of loop filter response $C_i$ 602 also includes the natural response of loop filter 504 to each input signal vector $X_t$, t={0, 1, ..., T-1} for all operational time T. The input signal natural response $SNAT_t$ is determined by quantizer 500 once for each input signal vector $X_t$ by setting the feedback in loop filter 504 to zero (0) and determining the response to input signal vector $X_t$.

Figure 1:
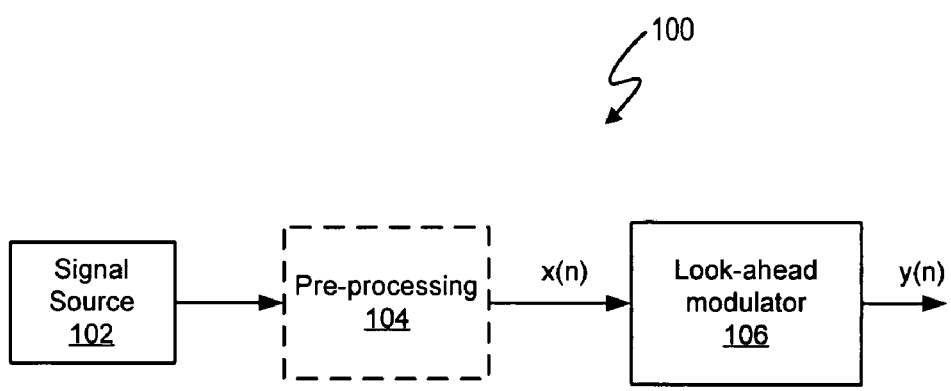
FIG. 1 (labeled prior art) depicts a signal processing system having a look-ahead delta-sigma modulator.
Figure 2:
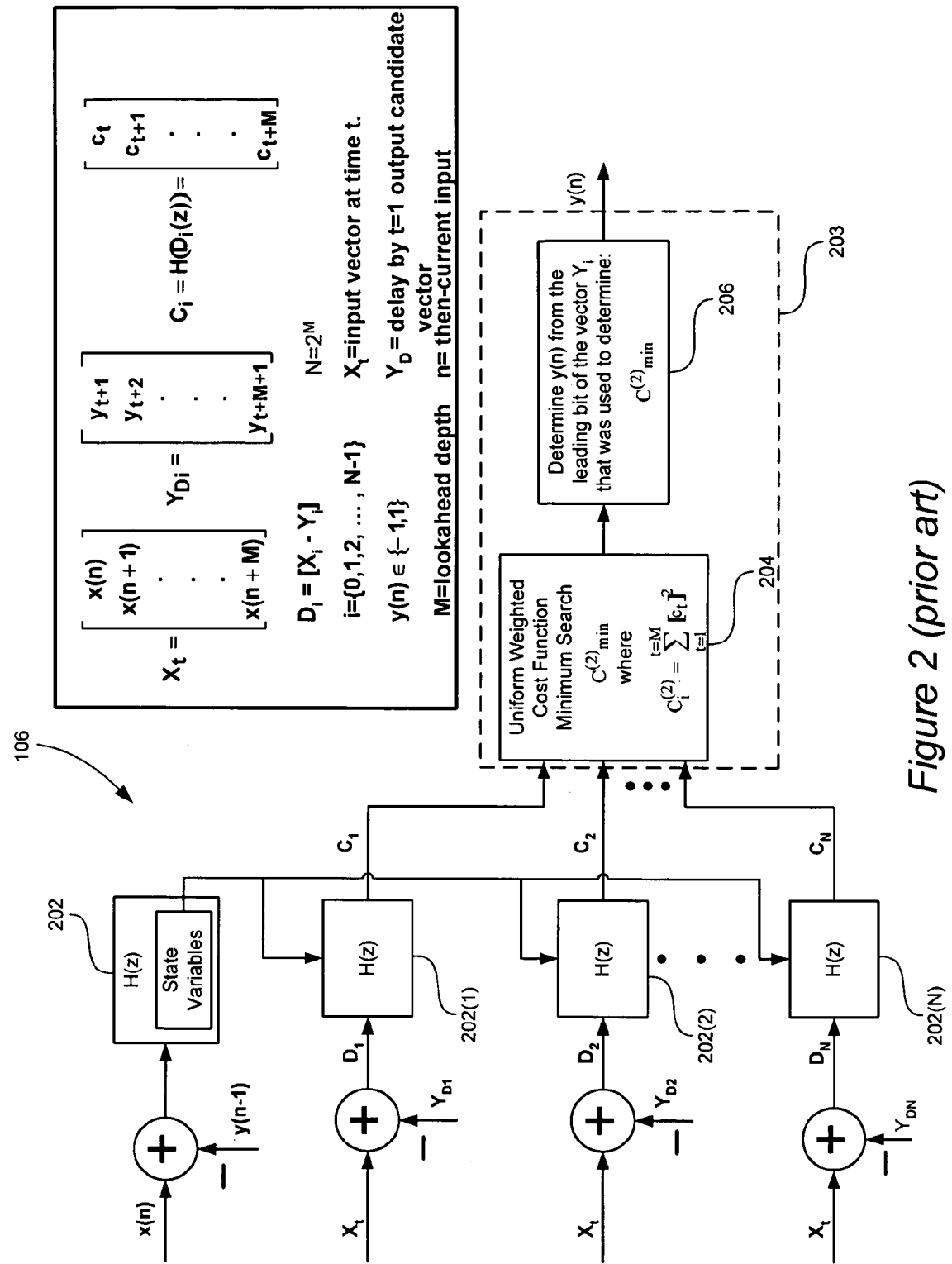
FIG. 2 (labeled prior art) depicts a schematic representation of a conventional look-ahead delta-sigma modulator.
Figure 3:
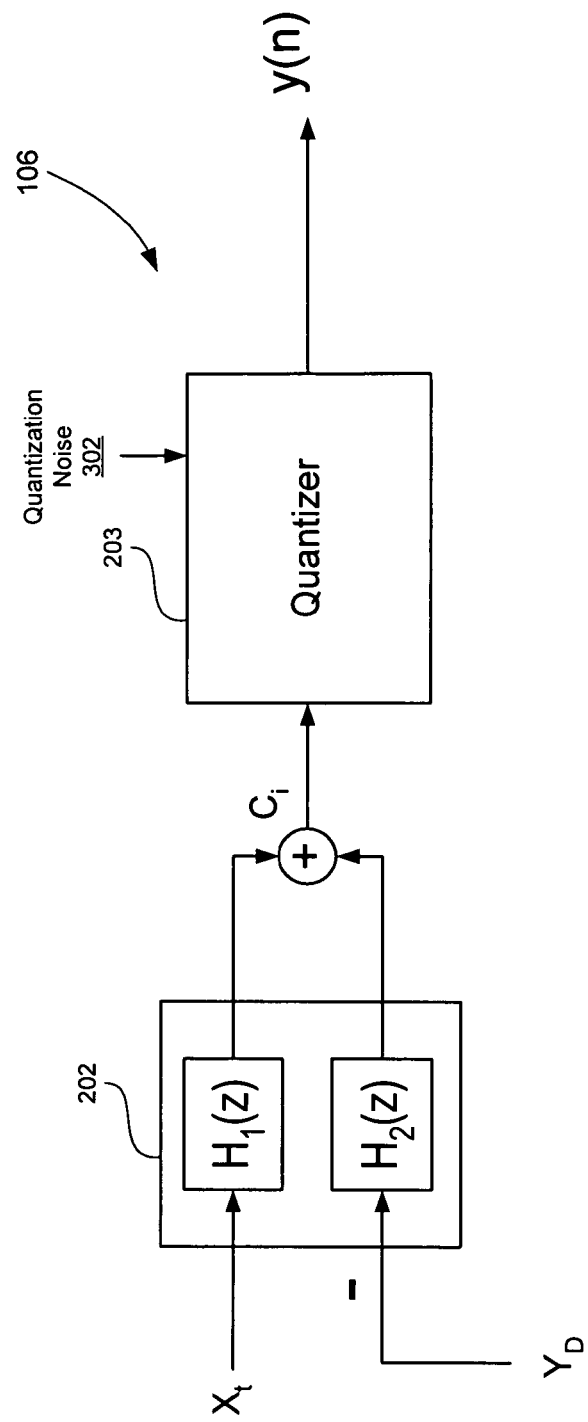
FIG. 3 (labeled prior art) depicts a quantizer and noise shaping filter.
Figure 4A:
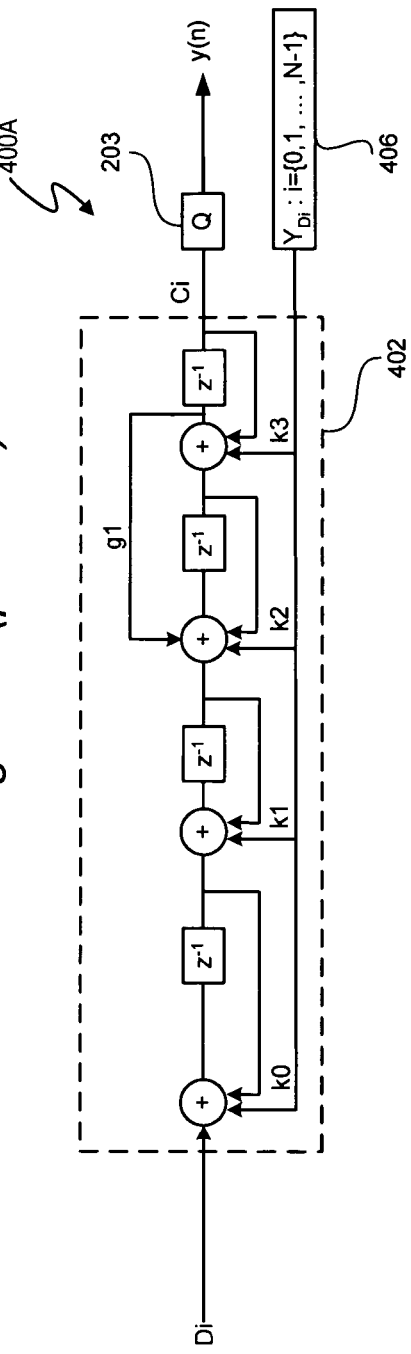
FIG. 4A (labeled prior art) depicts a delta sigma modulator with a fourth order noise shaping loop filter.
Figure 4B:
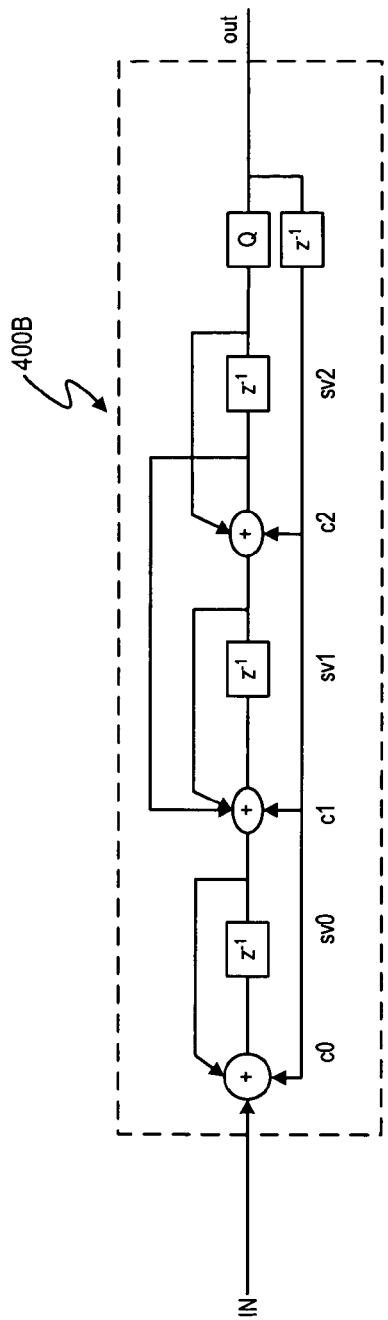
FIG. 4B (labeled prior art) depicts a third order infinite impulse response (IIR) filter.
Figure 4D:
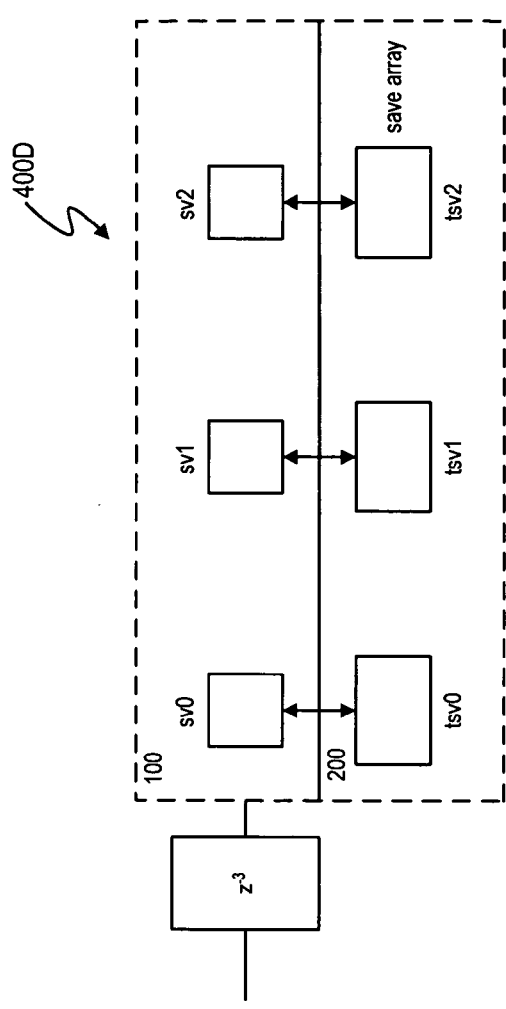
FIG. 4D (labeled prior art) depicts state variable memory operations for the IIR filter of FIG. 4B.
Figure 4C:
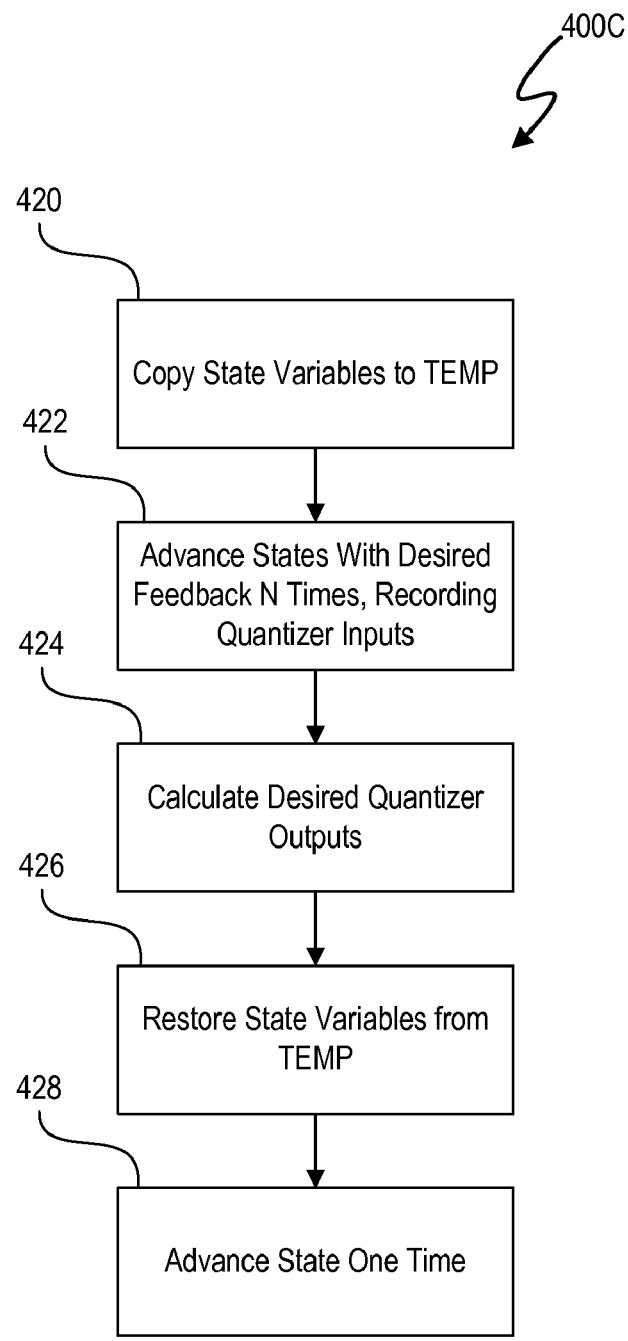
FIG. 4C (labeled prior art) depicts a technique to implement an IIR filter adapted for look-ahead operations.
Figure 6A:
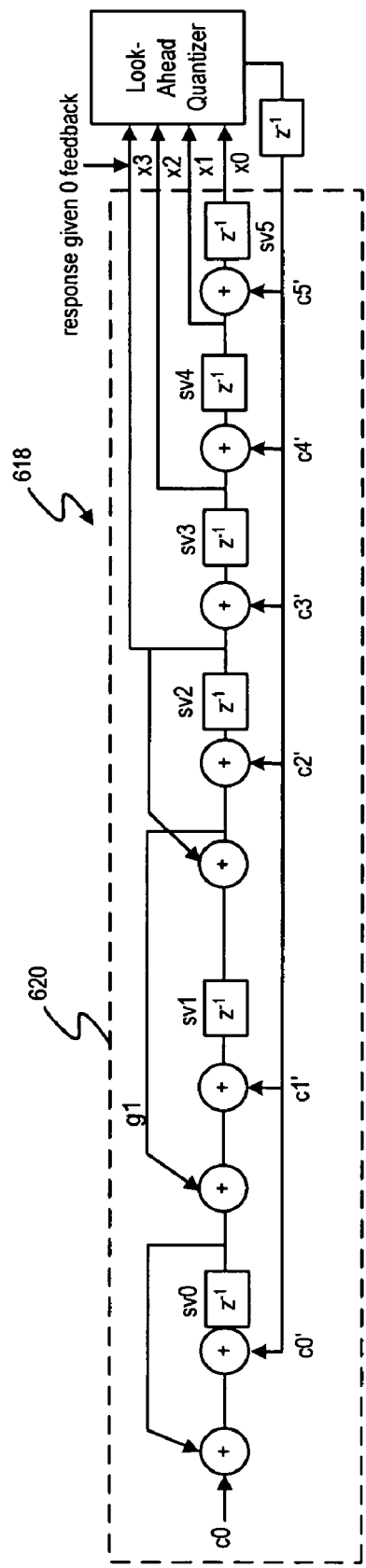
FIGS. 6A–6G depict the design and implementation of an infinite impulse response filter for look-ahead delta sigma modulators.

FIG. 6A depicts a look-ahead delta-sigma modulator 618 of order 3, with look-ahead depth of 4. The IIR filter 620 provides one embodiment of a low computation, low memory system for calculation of future state variables. Filter 620 uses a very modest state variable storage of 6 states and, in one embodiment, does not save states or multiple copies of state variables. In one embodiment, state variables sv0, sv1, sv2 are updated in a manner equivalent to that of FIG. 4B, with different coefficients used. State variables sv3, sv4, sv5 form a simple delay line from sv2, with feedback corrections added. The value of sv5 is equivalent to the value in sv0 of FIG. 4B; in other words, the feedback coefficients are calculated in such a way as to form the same transfer function. sv4 is the output of the filter, under the assumption that the next feedback value will be 0. Similarly, sv3 is advanced by two time steps, and sv2 by three time steps.

Figure 6B:
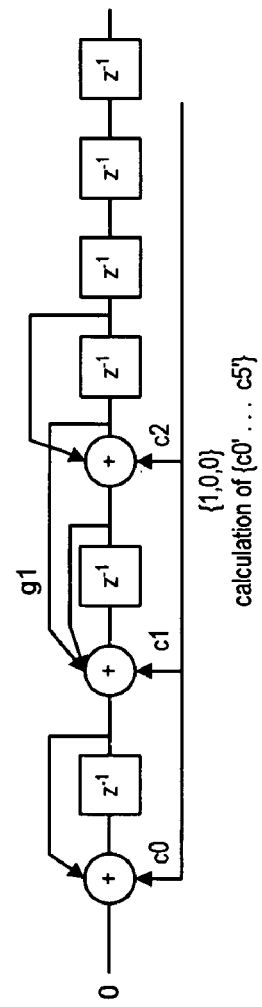
Figure 6C:
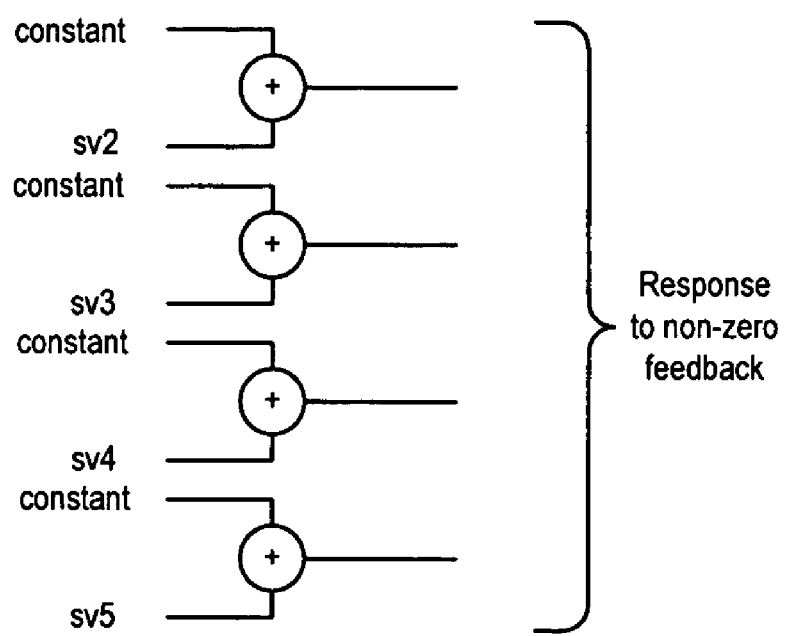

The feedback coefficients used in the look-ahead filter can be derived from the prototype filter by simple arithmetic as depicted in FIG. 6B. The modified filter is reset to 0, and presented with a 0 input. The feedback is stimulated with the vector {1,0, ... 0} to advance state, where the total vector length is the look-ahead depth. The resulting values in the state variables sv0, sv1, ... are then the values to be used for the new feedback coefficients, c0', c1', c2', .... Again, this value is pre-calculated, and requires no run time computation as shown in FIG. 6C.

Figure 6D:
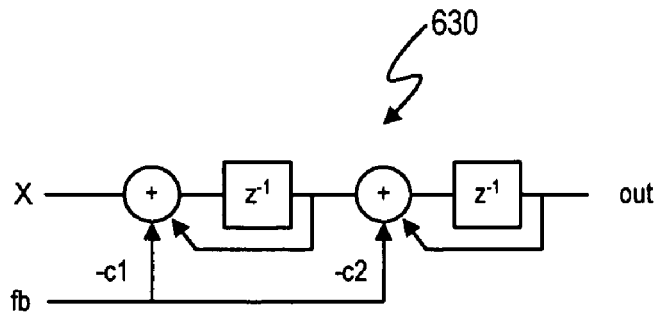
Figure 6E:
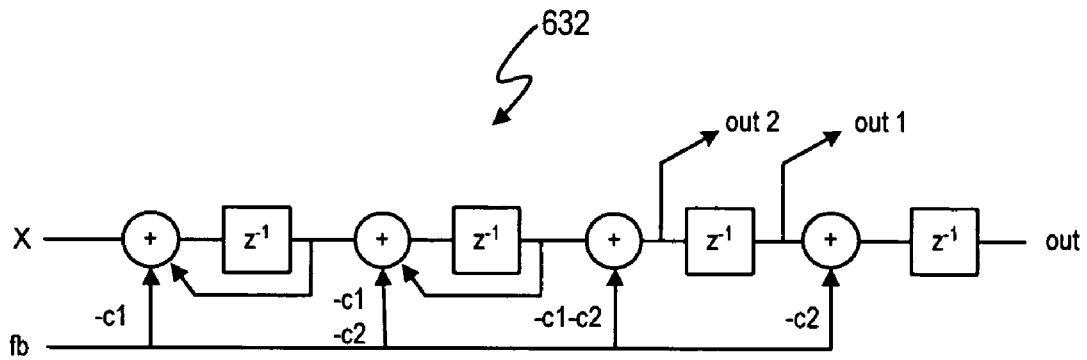
Figure 6F:
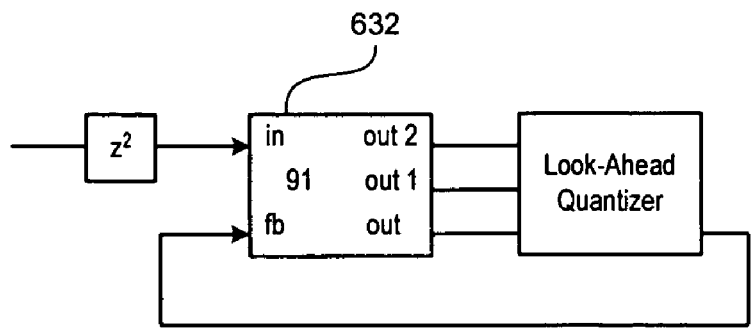

Filter 630 in FIG. 6D depicts an example of the filter transformation. Filter 630 can be used in a 2nd order delta-sigma modulator with an all-pole STF. Hx(z) represents the response of the filter 630 to the input terminal, and Hfb(z) represents the response of the filter 630 to the feedback terminal. FIG. 6E depicts filter 632 with the same response Hfb(z) as filter 630, but with the advantage of having two other outputs, out1 and out2. Out1 is the next output out of the filter 632, assuming 0 feedback for the current sample. Similarly, out2 is advanced by two time steps. The STF of filter 632 differs from the STF of filter 630 by $z^{-2}$, or a delay of 2. This delay can be ignored in many cases (the actual signal delay is often of no interest) or the input can be advanced by two samples. FIG. 6F depicts the use of filter 632 in a lookahead delta sigma modulator having a depth of 2. The compensating advance in the signal input is shown as $z^2$.

Figure 6G:
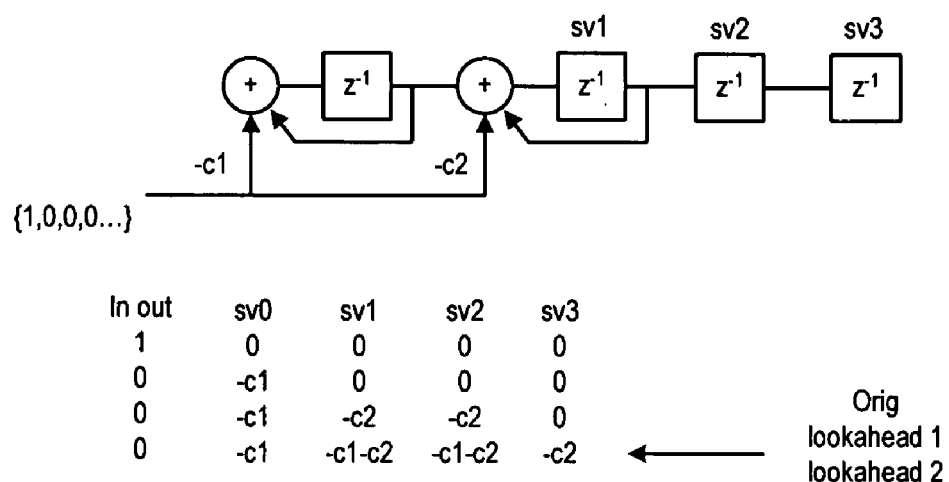

FIG. 6G depicts the generation of new coefficients for filter 632. The additional delays are inserted at the end of filter 630, and an impulse applied to the feedback terminal. Time is advanced by (1+look-ahead depth) cycles, and the final state variable values are recorded as the new filter's feedback coefficients. The resulting filter has the same feedback transfer function as the feedback transfer function of filter 630, with the future output values now available. If c1=1 and c2=2, filter 632 represents a feedback filter for a second order delta-sigma modulator having a NTF of $(1-z^{-1})^2$. The mapped coefficients would be $\{-1, -4, -3, -2\}$.

The design and implementation principles described and depicted in FIGS. 6A–6G can be extended to look-ahead delta sigma modulator filters of any depth M.

Figure 7:
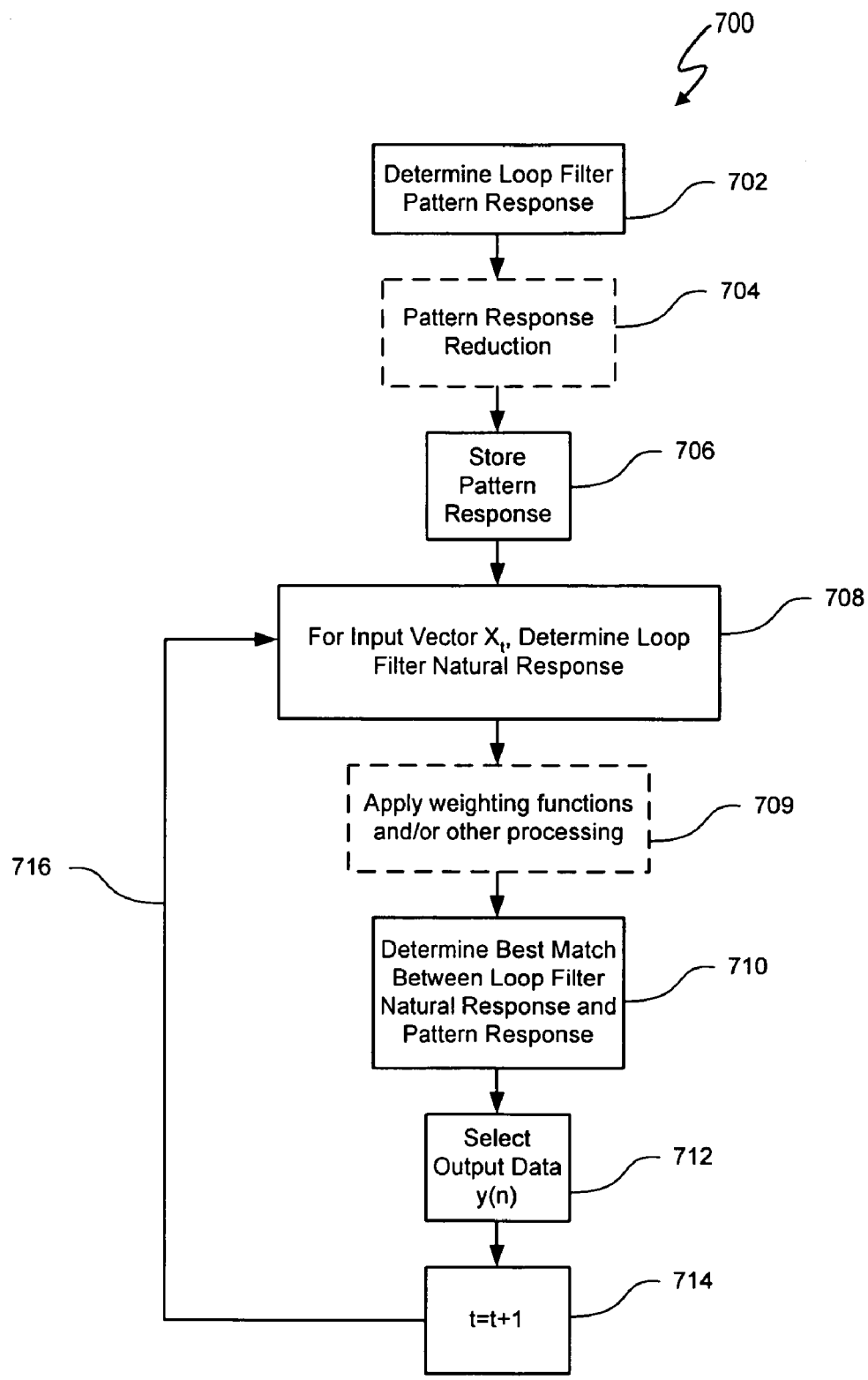
FIG. 7 depicts a look-ahead delta sigma modulator quantization process.

FIG. 7 depicts an illustrative look-ahead delta sigma modulator quantization process 700 using pattern and natural response to quantize input signal X. Quantization process 700 can be implemented in hardware, software, or a combination of hardware and software. Process 700 determines the forced pattern responses SPAT for each output candidate vector $Y_i$ as described above. In one embodiment shown in operation 702, a forced pattern response is computed for each $Y_i$, i={1, 2, . . . , N−1}. In another embodiment, some of the forced pattern responses produce duplicate results. Operation 704 indicates that the redundant information in the forced pattern responses does not need to be stored. As an example, the response to $\{+1,+1,-1,-1\}$ is the arithmetic inverse of the response to $\{-1,-1,+1,+1\}$. Additionally, the responses to $\{+1,+1,-1,-1\}$ and $\{+1,+1,-1,+1\}$ have the same three first values. Operation 706 stores the precomputed forced pattern responses for subsequent use with all input signal vectors $X_t$.

Operation 708 determines the natural response $SNAT_t$ for input signal vector $X_t$. Optional operation 709 adds weighting vectors to the loop filter response $C_i$ as, for example, described in the Melanson II Patent. Other processing includes minimizing quantization noise as described in the Melanson I Patent.

Operation 710 determines the best match for each input signal vector $X_t$ between the set of forced pattern responses and the loop filter input signal natural response for $X_t$.

If 'best match' is predefined to mean the minimum loop filter output response power for each input signal vector $X_t$, then the power of each vector $C_i$ is determined for each input signal vector $X_t$. The power of $C_i$ is $C_i^2 = (SNAT_t - SPAT_i)^2 = SNAT_t^2 - 2 \cdot SNAT_t \cdot SPAT_i - SPAT^2$.

For a one-bit look-ahead delta sigma modulator, in operation 712 the quantizer output data y(n) is selected from the leading bit of the output candidate vector $Y_i$ from which the minimum filter response $C_{i\ min}$ was generated. In at least one embodiment, the output data y(n) is the leading bit of the output candidate vector $Y_i$ from which the 'best match' filter response $C_{i\ min}$ was generated. In another embodiment, if a vector V approximating an output candidate vector $Y_i$ is used to determine the minimum filter response $C_{i\ min}$, then the approximated output candidate vector $Y_i$ is associated with the forced pattern response of the vector V, and the output data y(n) is selected as the leading bit of the output candidate vector $Y_i$.

Operation 714 advances quantization process 700 to quantize the next input signal $X_t$ for sample t=t+1 in operation 708. The return path 716 to operation 708 illustrates that the forced pattern responses SPAT, in one embodiment, need only be computed once.

In a binary system, the number of unique output candidate vectors for a depth of M is $2^N$. When determining the best match between the natural response and the forced pattern responses, the number of forced pattern responses considered by best match generator 506 can be reduced to eliminate from consideration any forced pattern responses that provide duplicate outcomes from which to select an output value. For example, as the loop filter is a linear system, the response to −x is the negative of the response to x. This can be used to eliminate one-half of all pattern responses by pattern response reduction 704. For example, when depth M=4, two of the output candidate vectors are $Y_0 = [-1, -1, -1, -1]$ and $Y_{15} = [+1, +1, +1, +1]$. $SPAT_0$, corresponding to the loop filter response to output candidate vector $Y_0$, and $SPAT_{15}$, corresponding to the loop filter response to output candidate vector $Y_{15}$, are arithmetic inverses.

Further simplification of the quantization calculations can be achieved by eliminating calculations that have no impact when determining the best match between the loop filter input signal natural response $SNAT_t$ and the loop filter pattern responses SPAT. This reduction can be based on arithmetic identities. When the predetermined best match criteria are identifying the minimum loop filter response output power, $C_{i\ min}^2 = [(SNAT_t - SPAT_i)^2 = SNAT_t^2 - 2 \cdot SNAT_t \cdot SPAT_i - SPAT_i^2]_{min}$, $SNAT_t^2$ is a constant for all $C_i$, and, thus has no effect on determining $C_{i\ min}^2$ and can be eliminated from the minimum power computation. Furthermore, $SPAT_i^2$ is a constant for each pattern response, and can, thus, be precomputed and stored in a memory and recalled for the power calculation. The "2" multiplier in "$2 \cdot SNAT_t \cdot SPAT_i$" need not be included in the power calculation because doubling $SNAT_t \cdot SPAT_i$ has no effect on determining $C_{i\ min}^2$. (although the precomputed $SPAT_i^2$ values are scaled by ½). Thus, the calculations of $C_i^2$ can be significantly simplified by eliminating calculations that will not affect $C_{i\ min}^2$. The computation now consists of a vector dot product (sum of products) and the addition of a constant.

Figure 8:
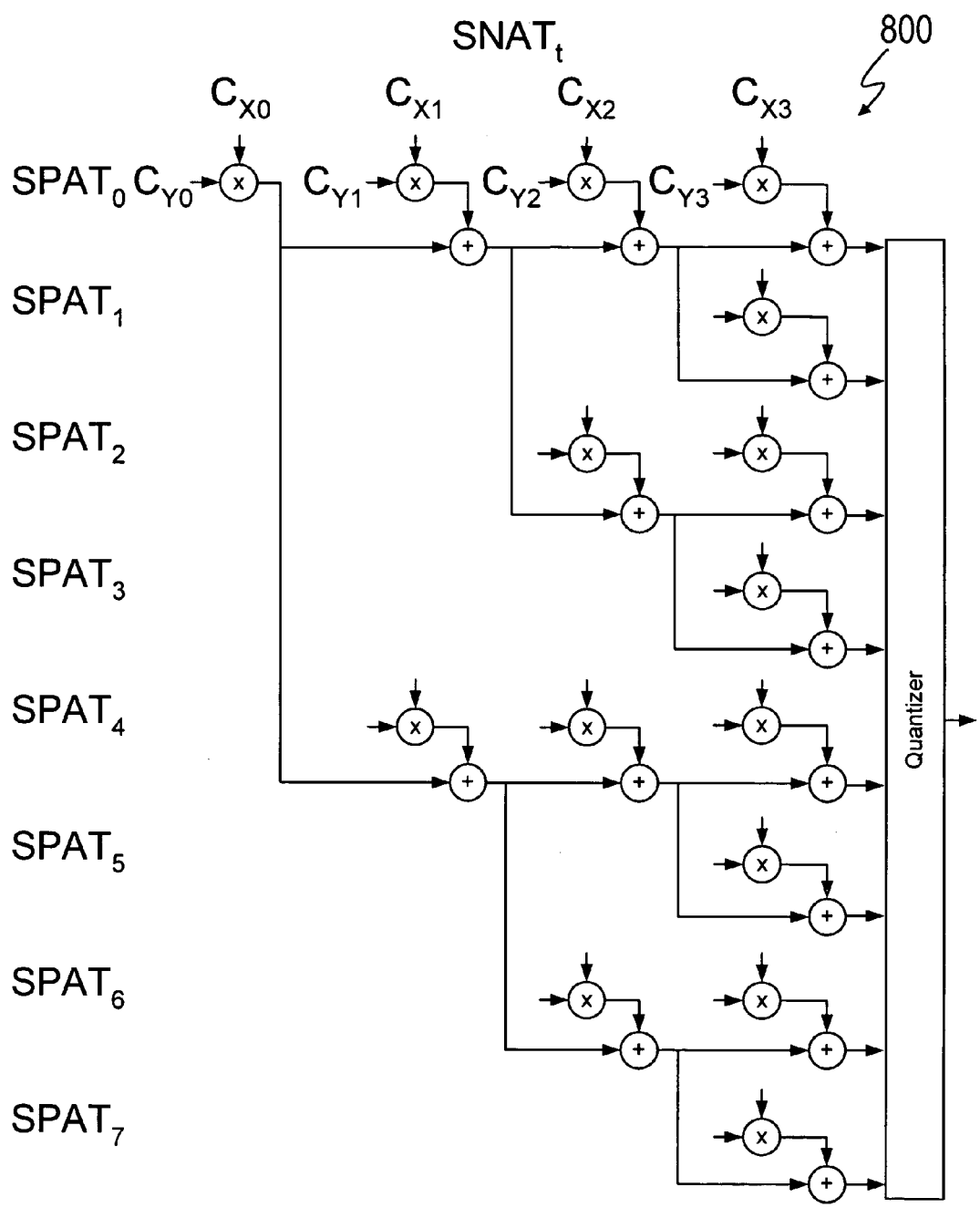
FIG. 8 depicts a computation reduction scheme.

FIG. 8 schematically depicts a computation reduction scheme 800 that reduces the number of computations used to select an output value in a look-ahead delta sigma modulator. Quantization computations can be further reduced by performing otherwise repetitive calculations only once. For all sets of $SPAT_i$, there are only two (2) values for the first element, four (4) for the second element, etc. This insight can be demonstrated in a straight forward manner, as there are only two possible values for the first element (−1, +1) of the $SPAT_i$ vector, hence only two possible filter responses. Similarly, there are only 4 possible values for the first two elements of the feedback. These multiplications can be shared across all ½, ¼, etc. of the total computations. This sharing reduces computation by ½. Together with the −/+ anti-symmetry of the total pattern, the computation is reduced by a factor of 4. Repetitive additions can also be shared to further reduce the number of computations. The reduction scheme depicts computation reduction for a depth of 4 can be easily extended using the same pattern as depicted in FIG. 8 for a look-ahead depth of M.

Computation reduction scheme 800 includes multipliers represented by "" and adders represented by "". $C_{X0}$, $C_{X1}$, $C_{X2}$, and $C_{X3}$ are the output values of filter 504 represented by vector $SNAT_t$ for time "t". $SPAT_0$ through $SPAT_7$ are respectively the output values of the eight output candidate vectors, $Y_0$ through $Y_7$. $SPAT_0$ through $SPAT_7$ all have anti-symmetry counterparts and, thus, are not needed to calculate the output value. Additionally, although not depicted in this embodiment, constants and variables can be included in the computations to modify $SPAT_i$. In one embodiment, $SPAT_0$ is the filtered response to $Y_0=\{-1, -1, -1, -1\}$, $SPAT_1$ is the filtered response to $Y_1=\{-1, -1, -1, +1\}$, $SPAT_2$ is the filtered response of $Y_2=\{-1, -1, +1, -1,\}$ and so on with $SPAT_7$ representing the filtered response to $Y_7=\{-1, +1, +1, +1\}$. Computation reduction scheme computes the dot product of SNAT and $SPAT_0$ and sums the result. For the dot product of SNAT and $SPAT_1$, the first three multiplications and additions, i.e. $C_{X0} \times C_{Y0} + C_{X1} \times C_{Y1} + C_{X2} \times C_{Y2}$, are identical for SNAT and $SPAT_0$ and are, thus, not repeated. For the dot product of SNAT and $SPAT_2$ the two multiplications and additions, i.e. $C_{X0} \times C_{Y0} + C_{X1} \times C_{Y1}$, are identical for SNAT and $SPAT_0$ and are, thus, not repeated, and so on. Thus, in general, the number of calculations used to determine the quantizer output can be significantly reduced by not performing redundant multiplications and storing repetitively used summation results. Computation reduction scheme 800 can be modified in any number of ways by, for example, retaining some repetitive calculations to reduce memory recall operations.

One embodiment of C++ code to perform one embodiment of the functions depicted by look-ahead delta sigma modulator 1000 follows:

```
//////////////////////////////////////////////
//////////////////////////////////////////////
//
//   Main delta sigma modulator- floating point
//   With look-ahead for best windowed quantization error
//
//////////////////////////////////////////////
//////////////////////////////////////////////
class sd9{                        // 9th order feedback type modulator
double sv[32],aheadcoef[32];
static double coef[9],g1[4];      // Coefficients for filter
static int sumsq[32768];          // Pre-computeded tables for look-ahead patterns
static double impulse[16][16];
static double weight[12][12];     // Window functions
int npat,leftbit;                 // 2^depth, 2^(depth-1)
int depthm4;                      // how far to search for overflow peak
int order, lastsv;
double im[10],iscale;             // Monitor of max value of integrators (diagnostic)
double target;                    // Set to one for a unity loop gain targer
int prev;
// local functions
inline int sd9::quanttr(void);          // The look-ahead code is here
inline int sd9::quanttr16(void);        // Same, uses factoring by 16
inline void crank(int q);
inline void crank(double in, int q);
public:
void sdreset(void);               // for startup of modulator
void prmax(void);                 // print out of integrator max values
void sd(double in, double *out);  // Actual modulator
void prstat(void);
int stats[4096][2];
};
double sd9::coef[9]=
// 65 k
{1.8618491415267613e-8, 7.676226899625688e-7, 0.00001721142114819406,
0.0002283476092014118, 0.002308029617862667, 0.01644612335991294,
0.08888632748972247, 0.33739883882758015, 0.8286652332985049};
// Local resonator gains
double sd9::g1[4]={-.00023, -.00085, -.0015, -.0020};
// For tapered weighting of the near vs later in time samples
double sd9::weight[12][12]={
    {1.0, 0.0, 0.0, 0.0, 0.0, 0.0, 0.0, 0.0, 0.0, 0.0, 0.0, 0.0},
    {2.0, 1.0, 0.0, 0.0, 0.0, 0.0, 0.0, 0.0, 0.0, 0.0, 0.0, 0.0},
    {2.0, 2.0, 1.0, 0.0, 0.0, 0.0, 0.0, 0.0, 0.0, 0.0, 0.0, 0.0}, //3
    {2.0, 2.0, 2.0, 1.0, 0.0, 0.0, 0.0, 0.0, 0.0, 0.0, 0.0, 0.0}, //4
    {4.0, 4.0, 3.0, 2.0, 1.0, 0.0, 0.0, 0.0, 0.0, 0.0, 0.0, 0.0}, //5
    {1.0, 1.0, 1.0, 1.0, 1.0, 1.0, 1.0, 1.0, 0.0, 0.0, 0.0, 0.0}, //6
    {4.5, 4.5, 4.5, 4.0, 3.0, 2.0, 1.0, 0.0, 0.0, 0.0, 0.0, 0.0}, //7
    {5.0, 5.0, 5.0, 5.0, 4.0, 3.5, 2.5, 1.2, 0.0, 0.0, 0.0, 0.0}, //8
    {7.0, 7.0, 7.0, 6.0, 5.0, 4.0, 3.0, 2.0, 1.0, 0.0, 0.0, 0.0}, //9
    {5.0, 5.0, 5.0, 5.0, 5.0, 4.6, 4.0, 3.5, 2.6, 1.2, 0.0, 0.0}, //10
    {7.0, 7.0, 7.0, 7.0, 7.0, 6.0, 5.0, 4.0, 3.0, 2.0, 1.0, 0.0}, //11
    {5.0, 5.0, 5.0, 5.0, 5.0, 5.0, 5.0, 4.5, 4.0, 3.5, 2.5, 1.5}}; //12
double sd9::impulse[16][16];
int sd9::sumsq[32768];            // Weighted sum of squares of above
// crank - turn the time crank one step in the filter
//
// This version calculates the current and future outputs simultaneously
//
inline void sd9::crank(double in, int q){
```

```
    for(int i=lastsv;i>=order;i--)sv[i]=sv[i-1];
    sv[8]+=sv[7] ;
    sv[7]+=sv[6] + sv[8]*g1[3];
    sv[6]+=sv[5] ;
    sv[5]+=sv[4] + sv[6]*g1[2];
    sv[4]+=sv[3] ;
    sv[3]+=sv[2] + sv[4]*g1[1];
    sv[2]+=sv[1] ;
    sv[1]+=sv[0] + sv[2]*g1[0];
    sv[0]+=in;
    if(q>0)for(i=0;i<=lastsv;i++)sv[i]+=aheadcoef[i];else for(i=0;i<=lastsv;i++)sv[i]-=aheadcoef[i];
};
// This version acts like the original prototype filter
// and is used only to calculate constants
inline void sd9::crank(int q){
    sv[8]+=sv[7] - coef[8]*q ;
    sv[7]+=sv[6] - coef[7]*q + sv[8]*g1[3];
    sv[6]+=sv[5] - coef[6]*q ;
    sv[5]+=sv[4] - coef[5]*q + sv[6]*g1[2];
    sv[4]+=sv[3] - coef[4]*q ;
    sv[3]+=sv[2] - coef[3]*q + sv[4]*g1[1];
    sv[2]+=sv[1] - coef[2]*q ;
    sv[1]+=sv[0] - coef[1]*q + sv[2]*g1[0];
    sv[0]+=    - coef[0]*q;
}
void sd9::sdreset(void){
    int i,j,pat,q;
    iscale=coef[0]*.5;
    order=9;lastsv=order-2+depth;depthm4=depth-4;
    for(i=0;i<10;i++)im[i]=0;
    npat=1<<depth;leftbit=npat/2;
    target=1.;prev=0;
//
// Pre-compute the 2^depth pattern responses
// For each possible pattern,
// Set all of the state variables to 0
// Input the pattern as feedback, with an input of 0. Record the filter outputs
//
    for(pat=0;pat<npat;pat++){
        for(i=0;i<=lastsv;i++)sv[i]=0;
        sumsq[pat]=0;
        for(i=0;i<depth;i++){
            q=(pat & (1<<(depth-1-i)) )?-1:1;
//
// We will use the fact that w(x-y)^2 = wx^2 - 2wxy + wy^2
// As we want the min, wx^2 is a constant that can be removed
// 2wy is stored in vector (per pattern) pats[pat]
// All of the wy^2 are summed into scaler sumsq[pat]
//
//
//         pats[pat][i]=(i8-target*q)*2*weight[depth-1][i]*256;
            sumsq[pat]+=int(floor((sv[8]-target*q)*(sv[8]-target*q)*weight[depth-1][i]*256));
            crank(q);
        }
//    fprintf(os,"%3x ",pat);for(i=0;i<depth;i++)fprintf(os," %8.3f",pats[pat][i]);fprintf(os,"\n");
    }
//
// This iteration makes a impulse response,
// and builds array aheadcoef, which maps the filter onto on incorporating
// look ahead.
//
    for(i=0;i<=lastsv;i++)sv[i]=0;
    q=1;
    for(i=0;i<depth;i++){
      for(j=lastsv;j>=order;j--)sv[j]=sv[j-1];
      crank(q);
      q=0;
    }
    for(i=0;i<=lastsv;i++)aheadcoef[i]=sv[i];
    for(i=0;i<depth;i++){
        for(j=0;j<depth;j++){
            impulse[i][j]=0;
            if(j==i)impulse[i][j]=-target*weight[depth-1][j]*2*256;
            if(j>i)impulse[i][j]=sv[order-1+i+depth-j]*weight[depth-1][j]*2*256;
        }
    }
```

-continued

```
// for(i=0;i<20;i++)fprintf(os,"%3d %8.5f\n",i,sv[i]);
    for(i=0;i<32;i++)sv[i]=0;
}
//
// In the quantizer, two simplifications are used.
// Symmetry is invoked, and only the first half of the patterns are looked at
// (the pattern +1 +1 −1 +1 has a pats vector that is the negative of −1 −1 +1 −1,
// while the sunsq is the same)
//
// Additionally, the pats have the same multiplications for early outputs if the
feedback would match
// A tree structure in the correlation takes advantage of this fact.
//
int sd9::quanttr(void){
    int impcor[4096];
    int impdot[12];
    int i,j;
    int qt;
    int stride;
//  int q=i8>0?1:−1; // old style for comparison (non look-ahead)
    for(i=0;i<depth;i++){
      impdot[i]=0;
      for(j=i;j<depth;j++)impdot[i]+=int(floor(.5+sv[lastsv−j]*impulse[i][j]));
    }
    impcor[0]=impdot[0]+impdot[depth−1];
    impcor[1]=impdot[0]−impdot[depth−1];
    int *p1=impcor+2,*p2;
    for(stride=2,i=depth−2; i>0;stride<<=1,i−−){
      int tdot=impdot[i];
      for(j=0,p2=impcor;j<stride;j++){
        *p1++ = *p2 −tdot;
        *p2++ +=tdot;
      }
    }
// Now do the search
    int best=999999;
    p1=impcor;p2=sumsq;
    for(i=0;i<leftbit;i++){
      if(*p1>0){
        int t=*p2++ − *p1++;
        if (t<best){best=t;qt=−1;}
      }else{
        int t=*p2++ + *p1++;
        if (t<best){best=t;qt=+1;}
      }
    }
    return qt;
}
void sd9::sd(double in, double *out){
    int q;
/******************************************
Main delta sigma loop - fp
in is the next sample to be encoded
out points to an output array, where a +−2 is placed
This is consistent with the SACD scaling definition, where
50% MI is considered full scale
******************************************/
    int i;
    q=quanttr( );
// do analog part
    *out++=q*2;
    crank(in*iscale,q);
};
//
// Quantizer that does calculation using a final matrix factoring of the adds
// Same result, fewer adds for large depths
int sd9::quanttr16(void){ //only works for depth >=6
      int impcor[4096];
      int impdot[12];
      int i,j;
      int qt;
      int stride;
//    int q=i8>0?1:−1; // old style for comparison (non look-ahead)
      for(i=0;i<depth;i++){
        impdot[i]=0;
        for(j=i;j<depth;j++)impdot[i]+=int(floor(.5+sv[lastsv−
j]*impulse[i][j]));
      }
        impcor[0]=impdot[0]+impdot[depth−5];
```

```
    impcor[1]=impdot[0]-impdot[depth-5];
int *p1=impcor+2,*p2;
for(stride=2,i=depth-6;i>0;stride<<=1,i--){
  int tdot=impdot[i];
  for(j=0,p2=impcor;j<stride;j++){
    *p1++ = *p2 -tdot;
    *p2++ +=tdot;
  }
}
int cor0= +impdot[depth-1]+impdot[depth-2]+impdot[depth-3]+impdot[depth-4];
int cor1= -impdot[depth-1]+impdot[depth-2]+impdot[depth-3]+impdot[depth-4];
int cor2= +impdot[depth-1]-impdot[depth-2]+impdot[depth-3]+impdot[depth-4];
int cor3= -impdot[depth-1]-impdot[depth-2]+impdot[depth-3]+impdot[depth-4];
int cor4= +impdot[depth-1]+impdot[depth-2]-impdot[depth-3]+impdot[depth-4];
int cor5= -impdot[depth-1]+impdot[depth-2]-impdot[depth-3]+impdot[depth-4];
int cor6= +impdot[depth-1]-impdot[depth-2]-impdot[depth-3]+impdot[depth-4];
int cor7= -impdot[depth-1]-impdot[depth-2]-impdot[depth-3]+impdot[depth-4];
int cor8= +impdot[depth-1]+impdot[depth-2]+impdot[depth-3]-impdot[depth-4];
int cor9= -impdot[depth-1]+impdot[depth-2]+impdot[depth-3]-impdot[depth-4];
int cora= +impdot[depth-1]-impdot[depth-2]+impdot[depth-3]-impdot[depth-4];
int corb= -impdot[depth-1]-impdot[depth-2]+impdot[depth-3]-impdot[depth-4];
int corc= +impdot[depth-1]+impdot[depth-2]-impdot[depth-3]-impdot[depth-4];
int cord= -impdot[depth-1]+impdot[depth-2]-impdot[depth-3]-impdot[depth-4];
int core= +impdot[depth-1]-impdot[depth-2]-impdot[depth-3]-impdot[depth-4];
int corf= -impdot[depth-1]-impdot[depth-2]-impdot[depth-3]-impdot[depth-4];
// Now do the search
int best=999999;int t;
p1=impcor;p2=sumsq;
for(i=0;i<(leftbit>>4);i++){
    t=*p1+cor0;if(t>0){t=*p2++ - t;if (t<best){best=t;qt=-1;}}else{t=*p2++ + t;if (t<best){best=t;qt=+1;}}
    t=*p1+cor1;if(t>0){t=*p2++ - t;if (t<best){best=t;qt=-1;}}else{t=*p2++ + t;if (t<best){best=t;qt=+1;}}
    t=*p1+cor2;if(t>0){t=*p2++ - t;if (t<best){best=t;qt=-1;}}else{t=*p2++ + t;if (t<best){best=t;qt=+1;}}
    t=*p1+cor3;if(t>0){t=*p2++ - t;if (t<best){best=t;qt=-1;}}else{t=*p2++ + t;if (t<best){best=t;qt=+1;}}
    t=*p1+cor4;if(t>0){t=*p2++ - t;if (t<best){best=t;qt=-1;}}else{t=*p2++ + t;if (t<best){best=t;qt=+1;}}
    t=*p1+cor5;if(t>0){t=*p2++ - t;if (t<best){best=t;qt=-1;}}else{t=*p2++ + t;if (t<best){best=t;qt=+1;}}
    t=*p1+cor6;if(t>0){t=*p2++ - t;if (t<best){best=t;qt=-1;}}else{t=*p2++ + t;if (t<best){best=t;qt=+1;}}
    t=*p1+cor7;if(t>0){t=*p2++ - t;if (t<best){best=t;qt=-1;}}else{t=*p2++ + t;if (t<best){best=t;qt=+1;}}
    t=*p1+cor8;if(t>0){t=*p2++ - t;if (t<best){best=t;qt=-1;}}else{t=*p2++ + t;if (t<best){best=t;qt=+1;}}
    t=*p1+cor9;if(t>0){t=*p2++ - t;if (t<best){best=t;qt=-1;}}else{t=*p2++ + t;if (t<best){best=t;qt=+1;}}
    t=*p1+cora;if(t>0){t=*p2++ - t;if (t<best){best=t;qt=-1;}}else{t=*p2++ + t;if (t<best){best=t;qt=+1;}}
    t=*p1+corb;if(t>0){t=*p2++ - t;if (t<best){best=t;qt=-1;}}else{t=*p2++ + t;if (t<best){best=t;qt=+1;}}
    t=*p1+corc;if(t>0){t=*p2++ - t;if (t<best){best=t;qt=-1;}}else{t=*p2++ + t;if (t<best){best=t;qt=+1;}}
    t=*p1+cord;if(t>0){t=*p2++ - t;if (t<best){best=t;qt=-1;}}else{t=*p2++ + t;if (t<best){best=t;qt=+1;}}
    t=*p1+core;if(t>0){t=*p2++ - t;if (t<best){best=t;qt=-
```

-continued

```
1;}}else{t=*p2++ + t;if (t<best){best=t;qt=+1;}}
        t=*p1+corf;if(t>0){t=*p2++ - t;if (t<best){best=t;qt=-
1;}}else{t=*p2++ + t;if (t<best){best=t;qt=+1;}}
        p1++;
    }
    return qt;
}
```

Figure 9:
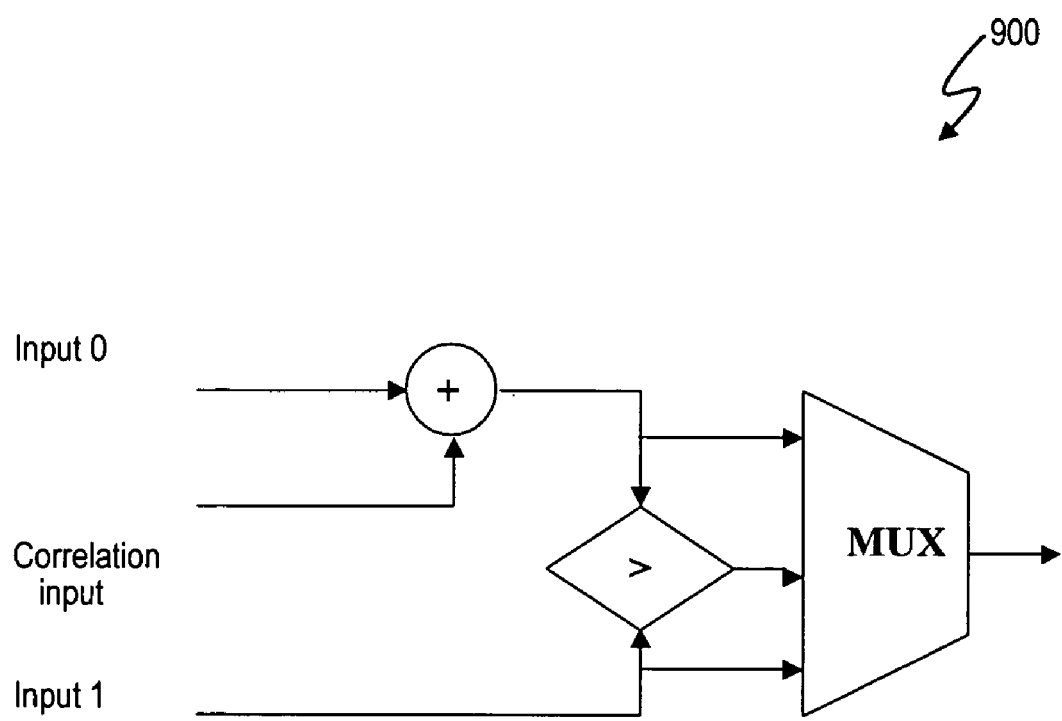
FIG. 9 depicts an add/compare/select network.
Figure 10:
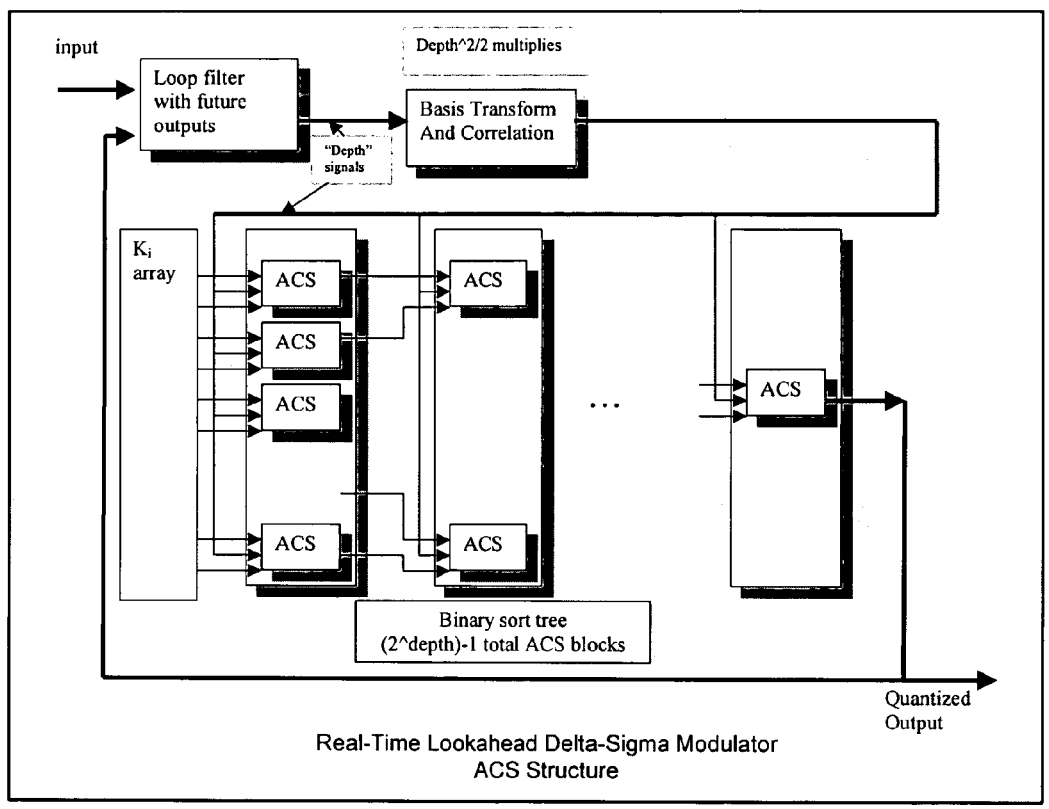
FIG. 10 depicts a look-ahead delta sigma modulator that uses and implements the add/compare/select network of FIG. 9.

An alternate way of computing $SNAT_i \cdot SPAT_i$ using the calculation reduction techniques described above is to use add/compare/select (ACS) networks 900 such as the network depicted in FIG. 9 in an implementation such as the look-ahead delta sigma modulator 1000 depicted in FIG. 10. Look-ahead delta sigma modulator 1000 represents one embodiment of look-ahead delta sigma modulator 500. Approximately $2^M-1$ ACS 900 networks, arranged in a tree, can implement look-ahead delta sigma modulator 1000.

An example that illustrates the concepts of ACS networks follows. The operation can be understood as follows. Assume a look-ahead depth of 4 (M=4), and:

e0=filter response to {1,0,0,0}
e1=filter response to {0,1,0,0}
e2=filter response to {0,0,1,0}
e3=filter response to {0,0,0,1}

Since the filter is a linear system, it follows that $SPAT_0$=filter response to $\{-1,-1,-1,-1\}=-e0-e1-e2-e3$.
Defining:

f0=e0·SNAT
f1=e1·SNAT
f2=e2·SNAT
f3=e3·SNAT

Then:
$SNAT \cdot SPAT_0 = -f0-f1-f2-f3$ and $SNAT \cdot SPAT_i$ for any "i" can be computed as a simple sum/difference of corresponding f values.

This operation dramatically reduces the computation of multiplications, which are more "expensive" than additions in terms of the number of computations. All cost values are now of the form:

cost0=k0−f0−f1−f2−f3
cost1=k1−f0−f1−f2+f3
cost2=k2−f0−f1+f2−f3
cost3=k3−f0−f1+f2+f3
cost4=k4−f0+f1−f2−f3
cost5=k5−f0+f1−f2+f3
cost6=k6−f0+f1+f2−f3
cost7=k7−f0+f1+f2+f3
cost8=k8+f0−f1−f2−f3
cost9=k9+f0−f1−f2+f3
cost10=k10+f0−f1+f2−f3
cost11=k11+f0−f1+f2+f3
cost12=k12+f0+f1−f2−f3
cost13=k13+f0+f1−f2+f3
cost14=k14+f0+f1+f2−f3
cost15=k15+f0+f1+f2+f3

As we only care about finding the minimum, there is no change in result if f0+f1+f2+f3 is added to each cost. Then we have:

cost0=k0
cost1=k1+2*f3
cost2=k2+2*+f2
cost3=k3+2*+f2+2*f3
etc.

Now the selection of cost0 and cost1 as the minimum candidate can be found without regard to the values of f0, f1, or f2. Similarly, the best candidate between cost2 and cost 3 can be found without knowing f0, f1, or f2, as f2 is a constant in both. So using only the k values and f3, the number of candidates can be halved. The ACS block of FIG. 9 performs this function.

Using only f2, and the results of the above calculations, the number of candidates can again be reduced by fifty percent (50%) with another stage of ACS elements. Similarly, this tree can be repeated until only one candidate, the best match, is selected.

By inclusion of weighting values in the distance calculations, a weighted look-ahead modulator is constructed with the same structure as above. The K values, and the multiplication constants used in the calculation of the e values will be modified by weights, which can be the only modification used.

One embodiment of C++ code to perform the ACS functions follows:

```
//
// Use and ACS (add-compare-select) inverse tree for the search
//
int sd9::quantacs(void){
    int acs[32768];
    int impdot[16];
    int i,j,qt;
//
// First, calculate the depth impulse response correlations
//
    for(i=0;i<depth;i++){
        impdot[i]=0;
        for(j=i;j<depth;j++)impdot[i]+=int(floor(.5+sv[lastsv-j]*impulse[i][j]));
    }
//
// Now do the (depth−1) stages of ACS. The first stage will
```

-continued

```
// have 2^(depth-1) ACS elements
// the last will have 2
//
// Most future done first, allows last acs to determine quantizer output
//
    int lentab; int *p2=sumsq;
    for(i=depth-1,lentab=leftbit;i>0;lentab>>=1,i--){
        int *p1=acs;
        int dot=impdot[i]<<1;
        for(j=0;j<lentab;j++){
            int t1 = *p2++;
            int t2 = *p2++ - dot;
            *p1++ = __min(t1,t2);
        }
        p2=acs;
    }
// The final stage is a single acs, with the mux output controlling the final result.
    qt = (acs[0]) >= (acs[1] - (impdot[0]<<1)) ? -1:1;
    return qt;
}
```

Figure 11:
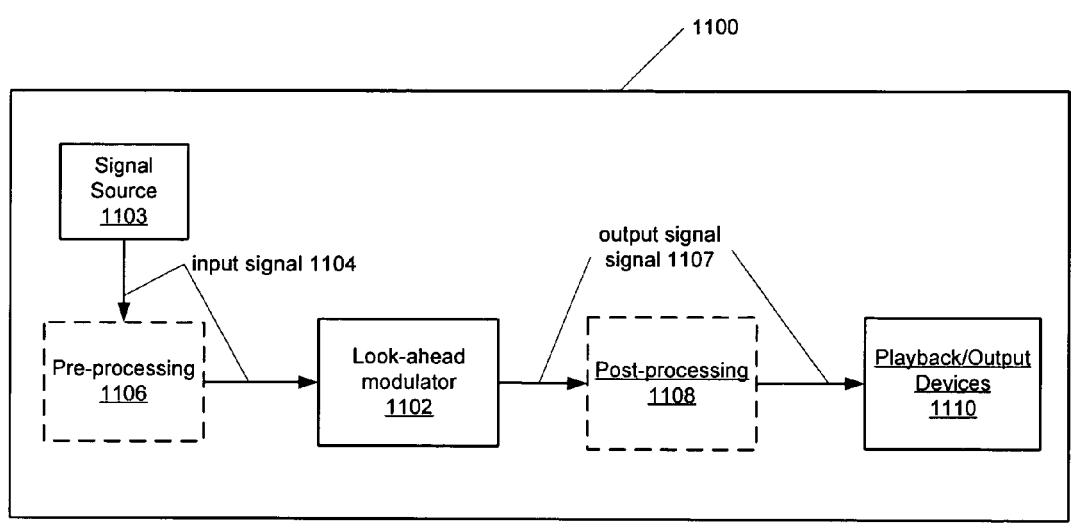
FIG. 11 depicts a signal processing system that includes a look-ahead modulator, an output device and process, and an output medium.

Referring to FIG. 11, signal processing system 1100 depicts one embodiment of a signal processing system that includes look-ahead modulator 500. Signal processing system 1100 is particularly useful for high-end audio applications such as super audio compact disk ("SACD") recording applications. Signal processing system 1100 processes an input signal 1104 generated by an input signal source 1103. The input signal 1104 may be digital or analog and may be from any signal source including signals generated as part of a recording/mixing process or other high end audio sources or from lower-end sources such as a compact disk player, MP3 player, audio/video system, audio tape player, or other signal recording and/or playback device.

The input signal 1104 may be an audio signal, a video signal, an audio plus video signal, and/or other signal type. Generally, input signal 1104 undergoes some preprocessing 1106 prior to being modulated by look-ahead modulator 1102. For example, pre-processing 1106 can involve an interpolation filter to oversample a digital input signal 1204 in a well-known manner. Pre-processing 1106 can include an analog-to-digital converter to convert an analog input signal 1104 into a digital signal. Pre-processing 1106 can also include mixing, reverberation, equalization, editing, out-of-band noise filtering and other filtering operations.

In the digital domain, pre-processing 1106 provides discrete input signals X[n] to look-ahead modulator 1102. Each discrete input signal x[n] is a K-bit signal, where K is greater than one. As previously described in more detail, look-ahead modulator 500 processes input signals X[n] and candidates Y[n] to determine an output signal 1107. Output signal 1107 is, for example, a collection of one-bit output values. The output signal 1107, thus, becomes an encoded version of the input signal 1104.

Figure 12:
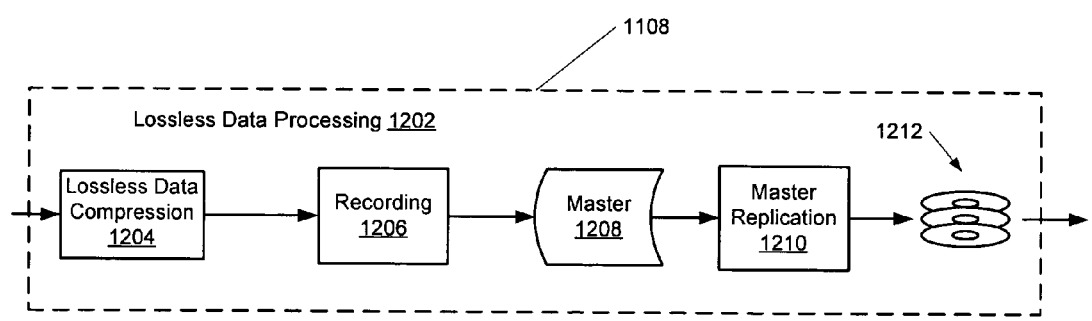
FIG. 12 depicts post-processing operations in an embodiment of the signal processing system of FIG. 11.

Referring to FIGS. 11 and 12, signal processing system 1100 typically includes post-processing 1108 to post-process the output signal 1107 of look-ahead modulator 500. Post-processing 1108 can include lossless data processing 1202. For SACD audio mastering, there is a lossless data compression stage 1204, followed by a recording process 1206 that produces the actual pits that are burned into a master storage medium 1208. The master storage medium 1208 is then mechanically replicated to make the disks (or other storage media) 1212 available for widespread distribution. Disks 1212 are, for example, any variety of digital versatile disk, a compact disk, tape, or super audio compact disk. Playback/output devices 1110 read the data from the disks 1212 and provide a signal output in a format perceptible to users. Playback/output devices 1110 can be any output devices capable of utilizing the output signal 1107. Thus, the storage media 1208 and 1212 include data encoded using signal modulation processes achieved using look-ahead modulator 500.

Although the present invention has been described in detail, it should be understood that various changes, substitutions and alterations can be made hereto without departing from the spirit and scope of the invention as defined by the appended claims. For example, quantization process 700 can be used in conjunction with conventional pruning techniques, which would reduce the fidelity of the output data but can also further simply calculations.

What is claimed is:

1. A method of processing input signal data using a look-ahead delta sigma modulator of depth N using natural and pattern loop filter responses, wherein N is greater than or equal to two, the method comprising:
    determining a set of forced pattern responses of a loop filter of the look-ahead delta sigma modulator to a set of vectors;
    determining a natural response of the loop filter of the look-ahead delta sigma modulator to a set of input data signal samples; and
    quantizing each input signal data sample by applying predetermined decision criteria to determine a best match between each forced pattern response and the natural response and selecting output data from an output candidate vector associated with the forced pattern response used to determine the best match.

2. The method as in claim 1 wherein:
    applying the predetermined decision criteria to determine the best match comprises determining a lowest power of the difference between one of the forced pattern responses and the natural response; and
    selecting output data from the output candidate vector associated with the forced pattern response used to determine the best match comprises selecting the output candidate vector associated with the lowest power difference.

3. The method as in claim 2 wherein determining a lowest power match between one of the forced pattern responses and the natural response comprises determining a dot product for each forced pattern response and the natural response.

4. The method as in claim 1 wherein:
applying the predetermined decision criteria to determine the best match comprises determining a lowest power match between one of the forced pattern responses and the natural response wherein at least one element of the forced pattern response is weighted with a weight different than any other element of the forced pattern response; and
selecting output data from the output candidate vector associated with the forced pattern response used to determine the best match comprises selecting the output candidate vector associated with the lowest power match.

5. The method as in claim 1 wherein the set of forced pattern responses excludes forced pattern responses that provide duplicate best match determinations.

6. The method as in claim 1 wherein determining the set of forced pattern responses of the loop filter of the look-ahead delta sigma modulator further comprises precomputing the set of forced pattern responses before quantizing each input signal data sample.

7. The method of claim 6 further comprising:
storing the precomputed set of forced pattern responses in a memory for use in subsequently quantizing each input signal data sample.

8. The method as in claim 1 further comprising:
computing the natural response only once for quantization of each filtered input signal data sample.

9. The method as in claim 1 wherein the set of input data signal samples used to determine the natural response of the loop filter equals N.

10. The method as in claim 1 wherein the set of candidate vectors is reduced to less than $2^N$ without decreasing quantization accuracy.

11. The method as in claim 1 wherein the input signal data sample comprises audio input signal data.

12. The method as in claim 1 further comprising:
recording quantized input signal data on storage media.

13. The method as in claim 1 further comprising:
for each time t, determining a dot product of each forced pattern response with the natural response using substantially only addition operations.

14. The method as in claim 1 wherein the set of vectors used to determine the set of forced pattern responses includes a set of output candidate vectors from which the output candidate vector associated with the forced pattern response is selected.

15. The method as in claim 1 wherein each forced pattern response is determined using initial loop filter state variables set to zero.

16. The method as in claim 1 wherein determining a set of forced pattern responses of the loop filter includes determining a set of forced pattern response of the loop filter by setting signal input data to the loop filter of the delta sigma modulator to at least approximately zero and filtering a set of output candidate vectors.

17. The method as in claim 1 wherein determining a natural response of the loop filter of the look-ahead delta sigma modulator to a set of input data signal samples includes setting feedback data to the loop filter to at least approximately zero and filtering the set of input data signal samples.

18. A signal processing system comprising:
a look-ahead delta sigma modulator comprising:
a loop filter;
a pattern response generator coupled to the loop filter to determine a set of forced pattern responses of the loop filter to a set of vectors;
a natural response generator to determine a natural response of the loop filter to a set of input data signal samples; and
a quantizer to receive output data from the loop filter and the set of forced pattern responses, wherein the quantizer includes a function generator to quantize each input signal data sample by applying predetermined decision criteria to determine a best match between each forced pattern response and the natural response and selecting output data from an output candidate vector associated with the forced pattern response used to determine the best match.

19. The signal processing system as in claim 18 wherein the set of vectors used to determine the set of forced pattern responses includes a set of output candidate vectors from which the output candidate vector associated with the forced pattern response is selected.

20. The signal processing system as in claim 18 wherein the pattern response generator determines the set of forced pattern responses of the loop filter to a set of vectors obtained by setting signal input data to the loop filter to at least approximately zero and filtering the set of vectors.

21. The signal processing system as in claim 18 wherein the natural response generator determines the natural response to a set of input data signal samples by setting feedback data to the loop filter to at least approximately zero and filtering the set of input data signal samples.

22. The signal processing system as in claim 18 further comprising:
a memory coupled to the loop filter to store the determined set of forced pattern responses of the loop filter for each output candidate vector.

23. The signal processing system as in claim 18 wherein:
applying the predetermined decision criteria to determine the best match comprises determining a lowest power match between one of the forced pattern responses and the natural response; and
selecting output data from the output candidate vector associated with the forced pattern response used to determine the best match comprises selecting the output candidate vector associated with the lowest power match.

24. The signal processing system as in claim 23 wherein determining a lowest power match between one of the forced pattern responses and the natural response comprises determining a dot product for each forced pattern response and the natural response.

25. The signal processing system as in claim 18 wherein:
applying the predetermined decision criteria to determine the best match comprises determining a lowest power match between one of the forced pattern responses and the natural response wherein at least one element of the forced pattern response is weighted with a weight different than any other element of the forced pattern response; and
selecting output data from the output candidate vector associated with the forced pattern response used to determine the best match comprises selecting the output candidate vector associated with the lowest power match.

26. The signal processing system as in claim 18 wherein the set of forced pattern responses excludes any forced pattern responses that provide duplicate best match determinations.

27. The signal processing system as in claim 18 wherein to determine the set of forced pattern responses of the loop filter of the look-ahead delta sigma modulator the natural response generator includes components to precompute the set of forced pattern responses before quantizing each input signal data sample.

28. The signal processing system as in claim 18 wherein the natural response generator generates the natural response only once for quantization of each filtered input signal data sample.

29. The signal processing system as in claim 18 wherein the set of input data signal samples used to determine the natural response of the loop filter equals N, wherein N is a look-ahead depth and is greater than or equal to two (2).

30. The signal processing system as in claim 18 wherein the set of output candidate vectors is reduced to less than $2^N$ without decreasing quantization accuracy, wherein N is a look-ahead depth and is greater than or equal to two (2).

31. The signal processing system as in claim 18 wherein the input signal data sample comprises audio input signal data.

32. The signal processing system as in claim 18 further comprising:
    signal processing and recording equipment to process output data from the quantizer and record the processed output data on storage media.

33. The signal processing system as in claim 18 wherein the quantizer further comprises:
    an add/compare/select system to combine each forced pattern response with the natural response using substantially only addition operations, compare the combinations, and select the output data.

34. An apparatus for processing input signal data using a look-ahead delta sigma modulator of depth N using natural and forced pattern loop filter responses, wherein N is greater than or equal to two (2), the apparatus comprising:
    means for determining a set of forced pattern responses of a loop filter of the look-ahead delta sigma modulator to a set of vectors;
    means for determining a natural response of the loop filter of the look-ahead delta sigma modulator to a set of input data signal samples; and
    means for quantizing each input signal data sample by applying predetermined decision criteria to determine a best match between each forced pattern response and the natural response and selecting output data from an output candidate vector associated with the forced pattern response used to determine the best match.

35. The apparatus as in claim 34 wherein the set of vectors comprises a set of output candidate vectors.

36. A method of processing input signal data using a look-ahead delta sigma modulator of depth N using natural and forced pattern loop filter responses, wherein N is greater than or equal to two, the method comprising:
    determining a response of a loop filter of the look-ahead delta-sigma modulator from a natural response of the loop filter to a set of N input data signal samples and a forced pattern response of the loop filter to a set of vectors; and
    quantizing each input signal data sample by applying predetermined decision criteria to determine a best match between each forced pattern response and the natural response and selecting output data from an output candidate vector associated with the forced pattern response used to determine the best match.

* * * * *